United States Patent
Wu et al.

(10) Patent No.: US 7,612,882 B2
(45) Date of Patent: Nov. 3, 2009

(54) OPTICAL GRATINGS, LITHOGRAPHY TOOLS INCLUDING SUCH OPTICAL GRATINGS AND METHODS FOR USING SAME FOR ALIGNMENT

(75) Inventors: Wei Wu, Mountain View, CA (US); Warren Robinett, Pittsboro, NC (US); Shih-Yuan Wang, Palo Alto, CA (US); Jun Gao, Saratoga, CA (US); Zhaoning Yu, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 420 days.

(21) Appl. No.: 11/584,461

(22) Filed: Oct. 20, 2006

(65) Prior Publication Data

US 2008/0094629 A1    Apr. 24, 2008

(51) Int. Cl.
  *G01B 11/00* (2006.01)
  *G01B 11/14* (2006.01)
(52) U.S. Cl. .................................. 356/401; 356/618
(58) Field of Classification Search ......... 356/399–401, 356/618
  See application file for complete search history.

(56) References Cited

U.S. PATENT DOCUMENTS

| | | | |
|---|---|---|---|
| 4,386,849 A | 6/1983 | Haeusler et al. | |
| 4,664,524 A * | 5/1987 | Hattori et al. | 356/401 |
| 5,216,257 A | 6/1993 | Brueck et al. | |
| 5,343,292 A * | 8/1994 | Brueck et al. | 356/509 |
| 5,459,578 A | 10/1995 | Park et al. | |
| 5,772,905 A | 6/1998 | Chou | |
| 6,150,231 A | 11/2000 | Muller et al. | |
| 6,246,067 B1 * | 6/2001 | Tullis | 250/559.3 |
| 6,275,621 B1 | 8/2001 | Terry | |
| 6,309,580 B1 | 10/2001 | Chou | |
| 6,365,059 B1 | 4/2002 | Pechenik | |
| 6,690,997 B2 | 2/2004 | Rivalto | |
| 6,696,220 B2 | 2/2004 | Bailey et al. | |
| 6,731,391 B1 | 5/2004 | Kao et al. | |
| 6,842,229 B2 | 1/2005 | Sreenivasan et al. | |
| 6,859,303 B2 | 2/2005 | Wang et al. | |
| 6,873,421 B2 | 3/2005 | Lim et al. | |
| 6,900,881 B2 | 5/2005 | Sreenivasan et al. | |
| 6,902,853 B2 | 6/2005 | Sreenivasan et al. | |
| 6,916,584 B2 | 7/2005 | Sreenivasan et al. | |

(Continued)

OTHER PUBLICATIONS

Chen, Carl G., et al., "Nanometer-accurate Grating Fabrication with Scanning Beam Interference Lithography," Proc. SPIE, vol. 4936, pp. 126-134, Dec. 2002.

(Continued)

*Primary Examiner*—L. G Lauchman

(57) ABSTRACT

Lithography tools and substrates are aligned by generating geometric interference patterns using optical gratings associated with the lithography tools and substrates. In some embodiments, the relative position between a substrate and lithography tool is adjusted to cause at least one geometric shape to have a predetermined size or shape representing acceptable alignment. In additional embodiments, Moiré patterns that exhibit varying sensitivity are used to align substrates and lithography tools. Furthermore, lithography tools and substrates are aligned by causing radiation to interact with optical gratings positioned between the lithography tools and substrates. Lithography tools include an optical grating configured to generate a portion of an interference pattern that exhibits a sensitivity that increases as the relative position between the tools and a substrate moves towards a predetermined alignment position.

27 Claims, 15 Drawing Sheets

U.S. PATENT DOCUMENTS

| | | |
|---|---|---|
| 6,916,585 B2 | 7/2005 | Sreenivasan et al. |
| 6,919,152 B2 | 7/2005 | Sreenivasan et al. |
| 6,921,615 B2 | 7/2005 | Sreenivasan et al. |
| 6,932,934 B2 | 8/2005 | Choi et al. |
| 6,954,275 B2 | 10/2005 | Choi et al. |
| 6,986,975 B2 | 1/2006 | Sreenivasan et al. |
| 7,027,156 B2 | 4/2006 | Watts et al. |
| 7,070,405 B2 | 7/2006 | Sreenivasan et al. |
| 7,077,992 B2 | 7/2006 | Sreenivasan et al. |
| 7,085,673 B2 | 8/2006 | Picciotto et al. |
| 7,114,938 B2 | 10/2006 | Chou |
| 7,119,911 B2 | 10/2006 | Tyczka et al. |
| 7,301,163 B2 * | 11/2007 | Brill et al. ............... 250/548 |
| 2004/0189938 A1 | 9/2004 | Eagan |
| 2006/0158651 A1 | 7/2006 | Watts et al. |
| 2007/0242272 A1 * | 10/2007 | Suehira et al. ............ 356/401 |
| 2007/0266875 A1 * | 11/2007 | Berge .................... 101/481 |

OTHER PUBLICATIONS

Theocaris, P.S., "Moire patterns formed by inclined gratings," Brit. J. Appl. Phys. (J. Phys. D.), Series 2, vol. 1, pp, 913-921, 1968.

* cited by examiner

OPTICAL GRATINGS, LITHOGRAPHY TOOLS INCLUDING SUCH OPTICAL GRATINGS AND METHODS FOR USING SAME FOR ALIGNMENT

FIELD OF THE INVENTION

The present invention generally relates to lithography techniques such as, for example, photolithography, imprint lithography, nanoimprint lithography, contact lithography, as well as precision deposition systems that employ shadowmasks. More particularly, the present invention relates to methods, devices, and systems for aligning substrates and lithography tools.

BACKGROUND OF THE INVENTION

Lithography techniques and methods, such as, for example, photolithography, imprint lithography, nanoimprint lithography, and contact lithography may be used to fabricate structures that include features having microscale (i.e., less than about 100 microns) or nanoscale (i.e., less than about 100 nanometers) dimensions. Such structures include, for example, integrated circuits, sensors, light-emitting diodes, and nanostructures. In lithographic techniques, multi-layer structures are fabricated in a layer-by-layer process.

Briefly, in photolithography, a layer of photoresist is provided over a substrate, and a selectively patterned mask or reticle is aligned over the layer of photoresist. Selected areas of the layer of photoresist material may be exposed to electromagnetic radiation through the patterned mask or reticle, which may cause a chemical and/or physical transformation in the selected areas of the layer of photoresist material. In a subsequent development step, either the selected areas of the layer of photoresist material that have been exposed to the electromagnetic radiation or the other areas of the layer of photoresist material that have been shielded from the electromagnetic radiation by the mask or reticle are removed from the underlying substrate. In this manner, the selected pattern in the mask or reticle may be positively or negatively transferred to the layer of photoresist material.

The underlying substrate then may be further processed (e.g., material may be removed, deposited, doped, etc.) through the patterned layer of photoresist material, thereby forming a selectively patterned layer (corresponding to the selectively patterned mask or reticle) in or on the underlying substrate. Additional selectively patterned layers then may be formed over the previously formed selectively patterned layer using additional masks or reticles as necessary.

In order to position each layer relative to the underlying layers, the substrate and the masks or reticles typically are marked with an alignment feature or mark. As each mask or reticle is positioned over the underlying substrate, the alignment feature on the mask or reticle may be aligned with the alignment feature on the substrate before exposing the layer of photoresist material to electromagnetic radiation through the mask or reticle.

In imprint lithography (including nanoimprint lithography), a layer of deformable material (such as, for example, uncured methylmethacrylate (MMA)) may be provided over a substrate. A selectively patterned surface of an imprint mold then may be aligned over the layer of deformable material and pressed into the layer of deformable material, thereby transferring the pattern in the selectively patterned surface of the imprint mold to the layer of deformable material. The deformable material may be cured to solidify the pattern formed in the layer of deformable material. The pattern formed in the layer of deformable material may include a plurality of relatively thicker regions and relatively thinner regions in the layer of deformable material.

At least a portion of the patterned layer of deformable material then may be etched or otherwise removed until the relatively thinner regions in the patterned layer of deformable material have been substantially removed, the remaining portions of the relatively thicker regions in the layer of deformable material forming a pattern over the underlying substrate. In this manner, the selected pattern in the imprint mold may be transferred to the layer of deformable material.

The underlying substrate then may be further processed (e.g., material may be removed, deposited, doped, etc.) through the patterned layer of deformable material, thereby forming a selectively patterned layer (corresponding to the selectively patterned imprint mold) in or on the underlying substrate. Additional selectively patterned layers then may be formed over the previously formed selectively patterned layer using additional imprint molds as necessary.

As in photolithography, in order to position each layer relative to the underlying layers, the substrate and the imprint molds typically are marked with an alignment feature or mark. As each imprint mold is positioned over the underlying substrate, the alignment feature on the imprint mold is aligned with the alignment feature on the substrate before pressing the imprint mold into the layer of deformable material on the surface of the underlying substrate.

In all lithography processes, it may be important to ensure that each layer formed or processed is accurately aligned with layers that have been previously formed or processed and layers to be subsequently formed or processed.

BRIEF SUMMARY OF THE INVENTION

In one particular embodiment, the present invention includes a method of aligning a lithography tool with a substrate. The substrate is provided with at least one substrate alignment feature comprising a first optical grating, and the lithography tool is provided with at least one tool alignment feature comprising a second optical grating. The first and second optical gratings are configured to generate a Moiré pattern in a beam of electromagnetic radiation when the beam is caused to interact with both the first and second optical gratings. Furthermore, the sensitivity of the Moiré pattern may vary with the relative alignment between the substrate and the lithography tool. The lithography tool is positioned relative to the substrate, and the tool alignment feature and the substrate alignment feature are roughly aligned with one another. A beam of electromagnetic radiation interacts with both the first optical grating and the second optical grating to generate a Moiré pattern, and the relative position between the substrate and the lithography tool is adjusted to cause the Moiré pattern to approximate or match a predetermined pattern that represents an acceptable degree of alignment between the substrate and the lithography tool.

In another embodiment, the present invention includes a method of aligning a lithography tool with a substrate in which the substrate is provided with at least one substrate alignment feature comprising a first optical grating, and the lithography tool is provided with at least one tool alignment feature comprising a second optical grating. The first and second optical gratings are configured to generate an interference pattern in a beam of electromagnetic radiation when the beam is caused to interact with both the first and second optical gratings. The lithography tool is positioned relative to the substrate, and the tool alignment feature and the substrate alignment feature are roughly aligned with one another. A beam of electromagnetic radiation interacts with both the first optical grating and the second optical grating to generate an interference pattern comprising a plurality of geometric shapes, and the relative position between the substrate and the lithography tool is adjusted to cause at least one of the geometric shapes to have at least one of a predetermined size and a predetermined shape that represents an acceptable degree of alignment between the substrate and the lithography tool.

In yet another embodiment, the present invention includes a lithography tool comprising an optical grating for aligning the lithography tool relative to a substrate. The optical grating includes a plurality of alternating light and dark regions configured to generate at least a portion of an interference pattern when a beam of electromagnetic radiation interacts with the optical grating of the lithography tool and an optical grating of the substrate. The interference pattern exhibits a pattern sensitivity that increases as the relative position between the lithography tool and the substrate is moved towards a predetermined alignment position between the lithography tool and the substrate.

In an additional embodiment, the present invention includes a method of aligning a lithography tool with a substrate. The lithography tool is roughly aligned with the substrate and a beam of electromagnetic radiation is caused to pass between the lithography tool and the substrate without passing through the lithography tool or the substrate. The radiation is caused to interact with both a first optical grating coupled to the substrate and a second optical grating coupled to the lithography tool to generate an interference pattern, and the relative position between the substrate and the lithography tool may be adjusted as necessary or desired to cause the interference pattern to approximate or match a predetermined pattern representing an acceptable degree of alignment between the lithography tool and the substrate.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawing in which:

DETAILED DESCRIPTION OF THE INVENTION

The illustrations presented herein are not meant to be actual views of any particular apparatus, system, or method, but are merely idealized representations which are employed to describe the present invention. Additionally, elements common between figures may retain the same numerical designation.

Figure 1:
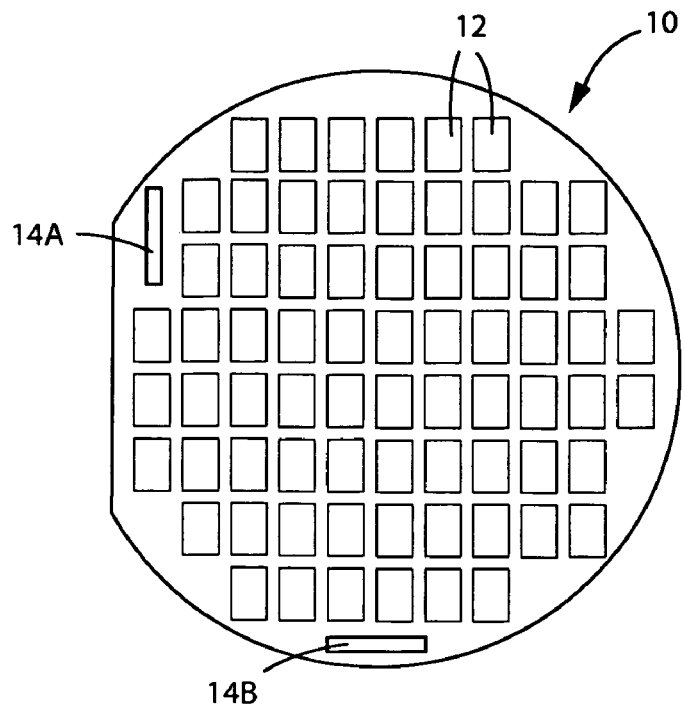
FIG. 1 is a plan view of a substrate comprising a semiconductor wafer that embodies exemplary teachings of the present invention and includes two alignment features thereon, each of which comprises an optical grating.

FIG. 1 is a plan view of an embodiment of a substrate 10 that embodies teachings of the present invention. The substrate 10 may include, for example, a full or partial wafer of a semiconductor material (e.g., silicon, gallium arsenide, indium phosphide, etc.). The substrate 10 optionally may include one or more at least partially formed semiconductor dies 12. As shown in FIG. 1, the substrate 10 may include a first alignment feature 14A and a second alignment feature 14B, each of which may include an optical grating, as described in further detail below.

Figure 2:
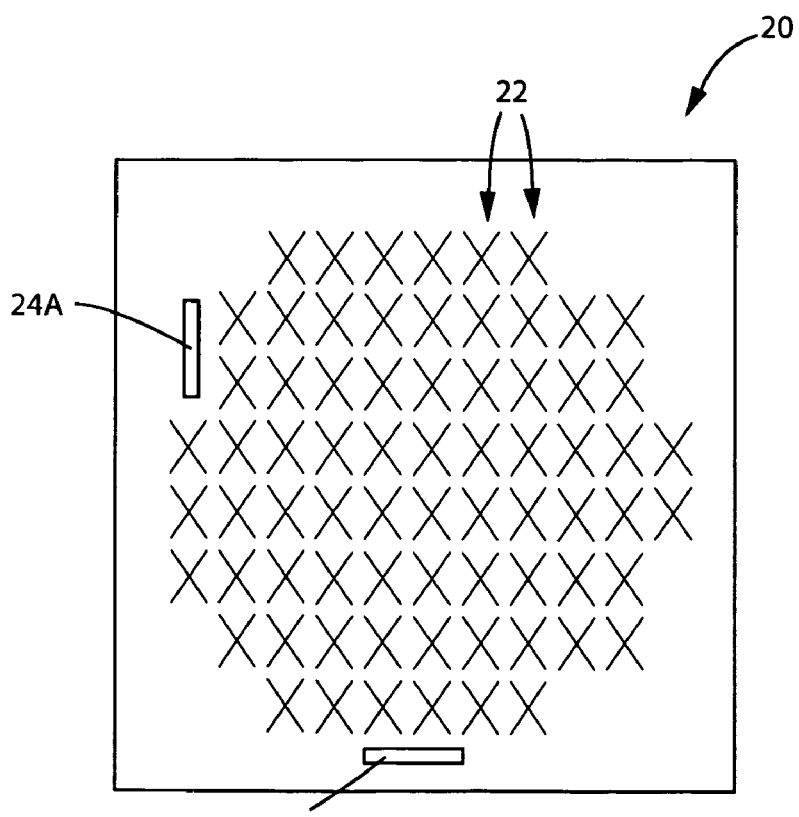
FIG. 2 is a plan view of a lithography tool comprising a nanoimprint lithography mold that embodies exemplary teachings of the present invention and also includes two alignment features thereon, each of which also includes an optical grating.

FIG. 2 is a plan view of a representative lithography tool 20 that embodies teachings of the present invention. In some embodiments, the lithography tool may be or may include a mask or reticle for use in photolithography. In additional embodiments, the lithography tool may be or may include a mold or die for use in imprint or nanoimprint lithography. The lithography tool 20 may include a plurality of features 22 that may be used to process the substrate 10 as part of a lithography process. For example, if the substrate 10 includes a mold or die for use in imprint or nanoimprint lithography, the features 22 may comprise a plurality of protrusions extending from a surface of the lithography tool 20, as known in the art. As another example, if the substrate 10 includes a mask or reticle for use in photolithography, the features 22 may comprise apertures extending through the lithography tool 20, as known in the art.

The features 22 are simply represented as X's in FIG. 2 for purposes of illustration herein and, in actuality, may have relatively complex shapes corresponding to features to be formed on the substrate 10, such as, for example, features to be formed on or in a surface of each of the at least partially formed semiconductor dies 12 of the substrate 10.

As shown in FIG. 2, the lithography tool 20 may include a first alignment feature 24A and a second alignment feature 24B, each of which may include an optical grating, as described in further detail below.

Figure 3:
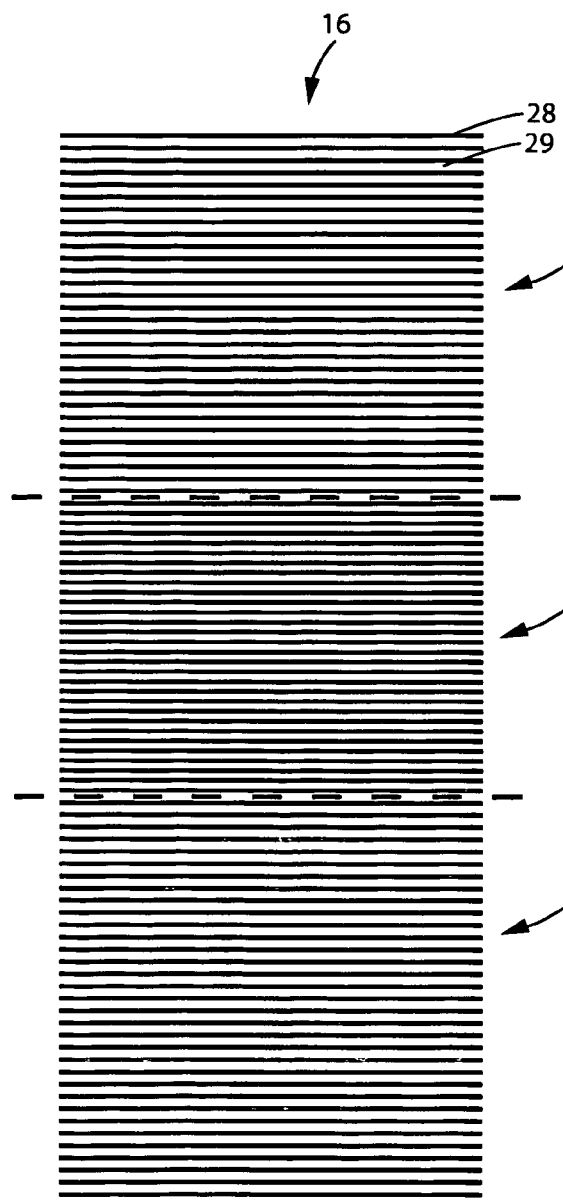
FIG. 3 is an enlarged simplified representation of one example of an optical grating that may be used as an alignment feature of one of the substrates shown in FIG. 1 or the lithography tool shown in FIG. 2.
Figure 4:
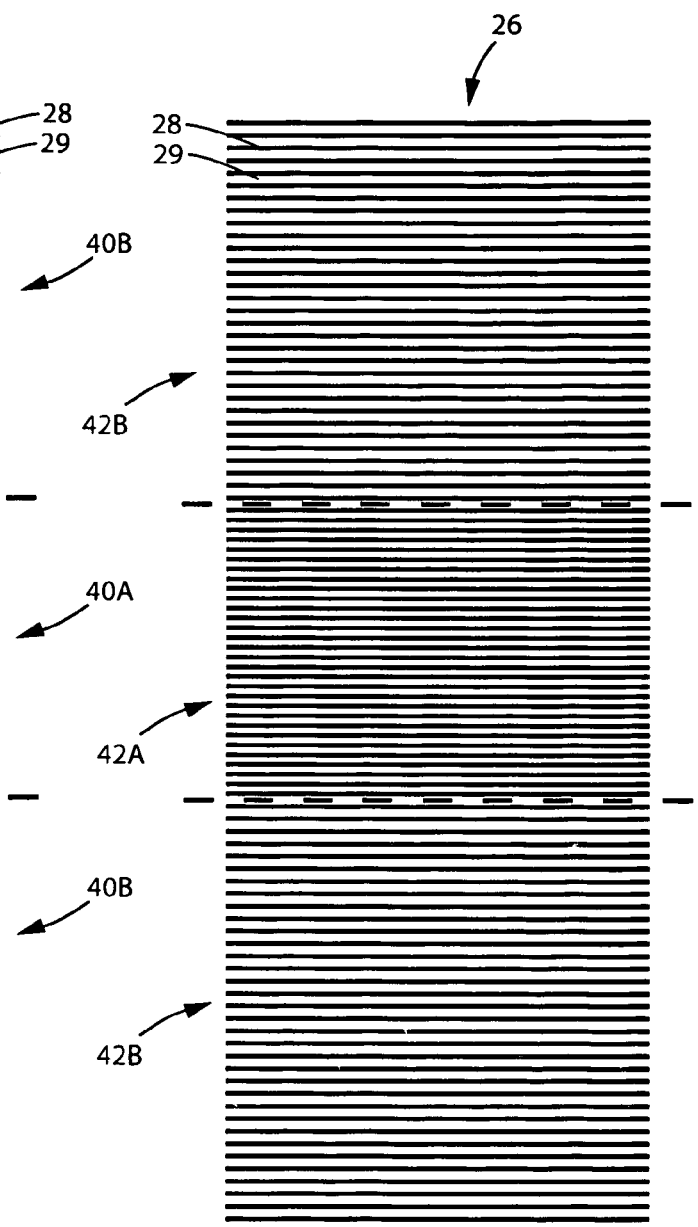
FIG. 4 is an enlarged simplified representation of one example of an optical grating that may be used as an alignment feature the other substrate shown in FIG. 1 or the lithography tool shown in FIG. 2.

FIG. 3 is an enlarged, simplified representation of an optical grating 16 that may form at least part of the first alignment feature 14A of the substrate 10 shown in FIG. 1. Similarly, FIG. 4 is an enlarged, simplified representation of an optical grating 26 that may form at least part of the first alignment feature 24A of the lithography tool 20 shown in FIG. 2. As shown in FIGS. 3-4, the optical gratings 16, 26 each include a plurality of alternating dark regions 28 and light regions 29. As used herein, the term "dark region" means any region of an optical grating that is configured to prevent electromagnetic radiation that impinges on that region from subsequently impinging on a radiation detector. As used herein, the term "light region" means any region of an optical grating that is configured to allow or cause electromagnetic radiation that impinges on that region to subsequently impinge on a radiation detector. For example, if a beam of electromagnetic radiation is caused to impinge on one side of an optical grating and a radiation detector is positioned on an opposite side of the optical grating, the light regions 29 of the optical grating may be substantially transparent to the electromagnetic radiation, and the dark regions 28 may substantially reflect and/or absorb the electromagnetic radiation. As another example, if a beam of electromagnetic radiation is caused to impinge on one side of an optical grating and a radiation detector is positioned on that same side of the optical grating, the light regions 29 of the optical grating may be substantially reflective to the electromagnetic radiation, and the dark regions 28 may substantially transmit and/or absorb the electromagnetic radiation.

As discussed in further detail below, the optical grating 16 of the substrate 10 and the optical grating 26 of the lithography tool 20 each may be configured to generate a Moiré pattern comprising at least one Moiré fringe in a beam of electromagnetic radiation when the beam of electromagnetic radiation is caused to interact with (e.g., pass through, reflect from, etc.) both the optical grating 16 and the optical grating 26.

Figure 5:
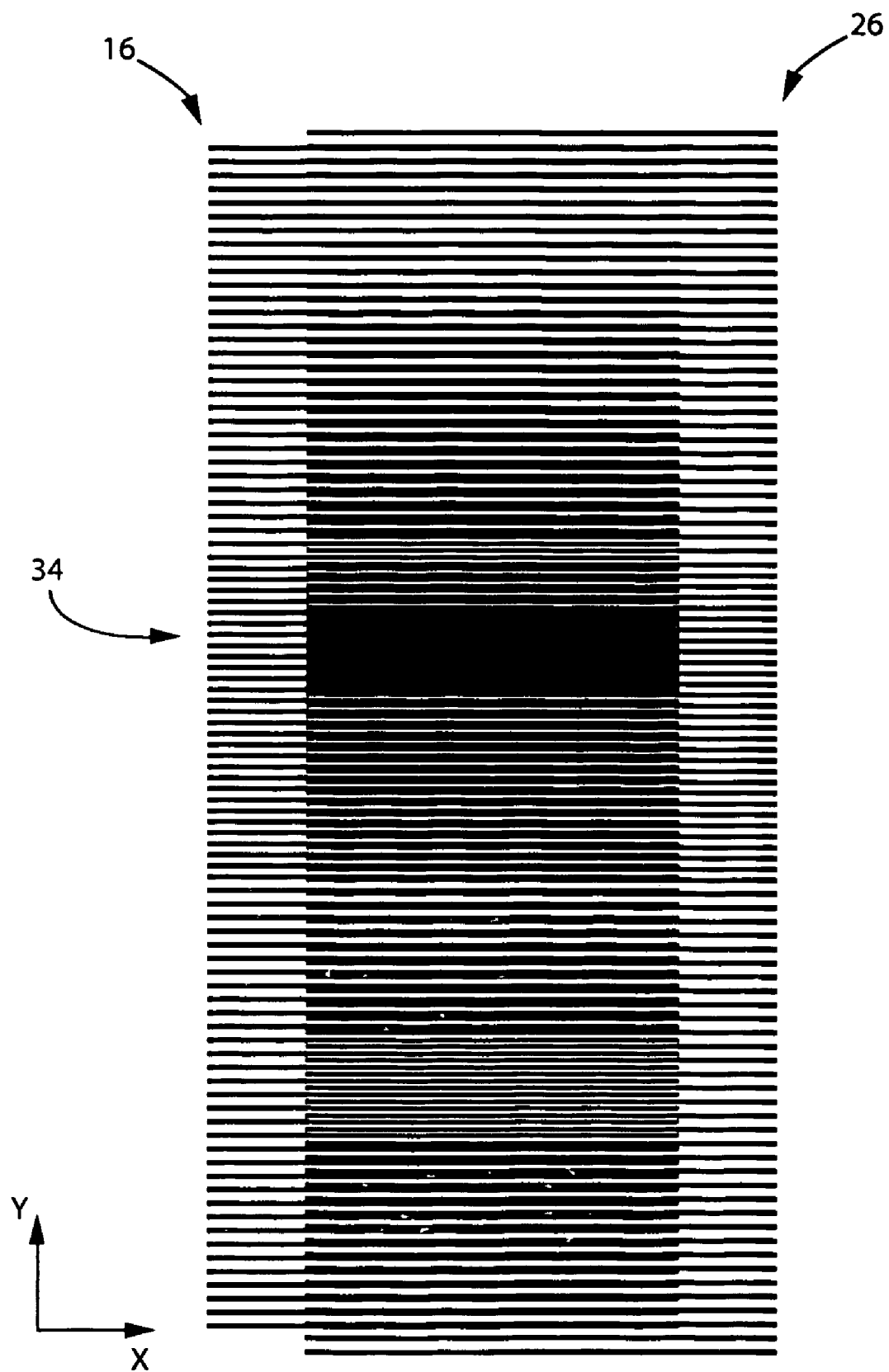
FIG. 5 is an enlarged, simplified representation of a Moiré pattern that may be generated by overlapping the optical grating shown in FIG. 3 and the optical grating shown in FIG. 4, and causing electromagnetic radiation to interact with both of the optical gratings.

FIG. 5 is an enlarged, simplified representation of the optical grating 16 of the first alignment feature 14A of the substrate 10 and the optical grating 26 of the first alignment feature 24A of the lithography tool 20 shown partially overlapping one another. As shown in FIG. 5, a Moiré pattern is generated within the area of overlap between the optical grating 16 and the optical grating 26. The Moiré pattern may include at least one Moiré fringe 34 (a relatively dark band, which is shown slightly above the center of the Moiré pattern in FIG. 5). As known in the art, Moiré patterns include a plurality of relatively larger light and dark regions (or fringes) that are defined by the relatively smaller light and dark regions of the optical gratings used to generate the Moiré patterns. The optical gratings 16, 26 may be configured to generate any configuration of Moiré pattern comprising any number of Moiré fringes 34.

As the optical grating 16 of the substrate 10 and the optical grating 26 of the lithography tool 20 are moved relative to one another in the Y direction shown in FIG. 5, the Moiré fringes 34 also may move across the Moiré pattern in the Y direction. In general, for an incremental shift $dy_{OG}$ in the relative position between the optical grating 16 (OG) of the substrate 10 and the optical grating 26 of the lithography tool 20, the corresponding incremental shift $dy_{MF}$ in the position of the Moiré fringes 34 (MF) across the Moiré pattern is greater than the incremental shift $dy_{OG}$. The ratio of the incremental shift $dy_{MF}$ to the incremental shift $dy_{OG}$ is referred to herein in relation to Moiré patterns as the "sensitivity" or "pattern sensitivity" of the Moiré pattern (i.e., Moiré pattern sensitivity is defined as $dy_{MF}/dy_{OG}$). In other words, if the relative position between the optical grating 16 of the substrate 10 and the optical grating 26 of the lithography tool 20 is adjusted in the Y direction at a constant first rate, one or more Moiré fringes 34 may move across the Moiré pattern in the Y direction at a second rate that is greater than the first rate.

Small relative movement between the lithography tool 20 and the substrate 10 may be more easily detected and tracked by detecting and tracking the movement of the Moiré fringes 34 across the Moiré pattern. Therefore, the position of the Moiré fringes 34 in the Moiré pattern may be used to provide information regarding the relative position between the alignment feature 14A and the alignment feature 24A of the lithography tool 20, and hence, the relative position between the substrate 10 and the lithography tool 20. In some embodiments, the position of the Moiré fringes 34 in the Moiré pattern may be used to provide information relating to the absolute position of the lithography tool 20 relative to the substrate 10 in at least one dimension.

Substrates and lithography tools that embody teachings of the present invention (such as, for example, the substrate 10 and the lithography tool 20) may include optical gratings that are configured to generate Moiré patterns in which the sensitivity of the Moiré pattern varies across the Moiré pattern. In other words, the Moiré fringes may exhibit a varying rate of displacement or movement across the Moiré pattern when the lithography tool is moved relative to the substrate at a substantially constant rate. As further described below, in this configuration, at least one region of the Moiré pattern may be used for relatively rough alignment (a region having relatively low pattern sensitivity) between the lithography tool 20 and the substrate 10, while at least one other region of the same Moiré pattern may be used for relatively fine alignment (a region having relatively high pattern sensitivity) between the lithography tool 20 and the substrate 10.

Referring again to FIGS. 3-4, the optical grating 16 of the first alignment feature 14A of the substrate 10 may have a central region 40A and two end regions 40B on opposite sides of the first central region 40A. Similarly, the optical grating 26 of the first alignment feature 24A of the lithography tool 20 may have a central region 42A and two end regions 42B on opposite sides of the first central region 42A. The boundaries between the central regions 40A, 42A and the end regions 40B, 42B are approximately represented by the dashed lines in FIGS. 3-4.

The central region 40A of the first alignment feature 14A of the substrate 10 and the central region 42A of the first alignment feature 24A of the lithography tool 20 may be configured to generate a Moiré pattern that exhibits a relatively high pattern sensitivity when the central region 40A is aligned with the central region 42A and a beam of electromagnetic radiation is caused to interact with both the central region 40A and the central region 42A (e.g., the beam of electromagnetic radiation is caused to pass through the central regions 40A, 42A, to pass through the central region 42A and reflect from the central region 40A, to reflect from both the central regions 40A, 42A, to pass through the central region 40A and reflect from the central region 42A, etc.).

In one particular embodiment, set forth merely as an example, the central region 40A of the optical grating 16 of the first alignment feature 14A of the substrate 10 may have at least about twenty (20) dark regions 28 (and, correspondingly, at least about nineteen (19) light regions 29). In some embodiments, the central region 40A may have several hundred dark regions 28, or even several thousand dark regions 28. Furthermore, each of the dark regions 28 and each of the light regions 29 of the central region 40A of the optical grating 16 of the substrate 10 may have a substantially rectangular shape and a width of about fifty (50) nanometers (i.e., a pitch of about one-hundred (100) nanometers, the pitch being defined as the shortest distance between one side of a dark region 28 and the same side of a next adjacent dark region 28). The central region 42A of the optical grating 26 of the lithography tool 20 may have approximately the same number of dark regions 28 (and, correspondingly, approximately the same number of light regions 29) as the central region 40A of the optical grating 16 of the substrate 10. Each of the dark regions 28 and each of the light regions 29 of the central region 42A of the optical grating 26 may have a substantially rectangular shape and a width of about fifty and one-half (50.5) nanometers (i.e., a pitch of about one-hundred and one (101) nanometers).

The end regions 40B of the optical grating 16 of the first alignment feature 14A of the substrate 10 each may have at least about twenty (20) dark regions 28 (and, correspondingly, at least about nineteen (19) light regions 29). In some embodiments, the end regions 40B may have several hundred dark regions 28, or even several thousand dark regions 28. Furthermore, each of the dark regions 28 and each of the light regions 29 of the end regions 40B of the optical grating 16 of the substrate 10 may have a substantially rectangular shape and a width of about one-hundred (100) nanometers (i.e., a pitch of about two-hundred (200) nanometers). The end regions 42B of the optical grating 26 of the lithography tool 20 may have approximately the same number of dark regions 28 (and, correspondingly, approximately the same number of light regions 29) as the end regions 40B of the optical grating 16 of the substrate 10. Each of the dark regions 28 and each of the light regions 29 of the end regions 42B of the optical grating 26 of the lithography tool 20 may have a substantially rectangular shape and a width of about one-hundred and five (105) nanometers (i.e., a pitch of about two-hundred and ten (210) nanometers).

In the above described embodiment, the optical grating 16 of the first alignment feature 14A of the substrate 10 and the optical grating 26 of the first alignment feature 24A of the lithography tool 20 each may be substantially symmetrical about a central axis (not shown) that bisects the central region 40A, 42A of each respective optical grating 16, 26 and extends generally parallel to the dark regions 28 and the light regions 29.

In the above described embodiment, the difference in pattern sensitivity between the central region of the Moiré pattern and the end regions of the Moiré pattern is provided by differing the width (often referred to as "line width") of the dark regions 28 and the light regions 29 between the central regions 40A, 42A and the end regions 40B, 42B of the optical gratings 16, 26 of the alignment features 14A, 24A, respectively. In additional embodiments, the difference in sensitivity between the central region of the Moiré pattern and the end regions of the Moiré pattern may be provided by differing any one or more of the width of the dark regions 28, the width of the light regions 29, the pitch (or frequency) of the pattern, and the duty cycle of the pattern (the duty cycle of the pattern being defined as the ratio of the width of the dark regions 28 to the width of the light regions 29).

In addition, in the above described embodiment, the region of the Moiré pattern (or the optical gratings 16, 26) having relatively high pattern sensitivity is located proximate the center of the Moiré pattern (the central regions 40A, 42A of the optical gratings 16, 26). In additional embodiments, the region of the Moiré pattern having relatively high pattern sensitivity may be located at an end of the Moiré pattern, or at any other location within the Moiré pattern. Furthermore, while the optical gratings 16, 26 of the alignment features 14A, 24A are configured to generate a Moiré pattern having discrete regions providing two levels of pattern sensitivity, in additional embodiments, the optical gratings 16, 26 of the alignment features 14A, 24A may be configured to generate a Moiré pattern having any number of different levels of pattern sensitivity. Furthermore, in additional embodiments, the optical gratings 16, 16 of the alignment features 14A, 24A may be configured to generate a Moiré pattern having a continuously varying sensitivity, and there may be no identifiable boundaries between regions exhibiting different sensitivity. For example, the optical gratings 16, 26 of the alignment features 14A, 24A may be configured to generate a Moiré pattern exhibiting a sensitivity that is highest near the center of the Moiré pattern and that decreases substantially continuously towards the end regions of the Moiré pattern. Furthermore, the sensitivity of the Moiré pattern may vary linearly or non-linearly (e.g., exponentially) across the Moiré pattern.

The second alignment feature 14B of the substrate 10 and the second alignment feature 24B of the lithography tool 20 may be substantially identical to the first alignment feature 14A of the substrate 10 and the first alignment feature 24A of the lithography tool 20, respectively. For example, the second alignment feature 14B of the substrate 10 may include an optical grating 16 as previously described herein, and the second alignment feature 24B of the lithography tool 20 may include an optical grating 26 as also previously described herein. The second alignment feature 14B of the substrate 10 and the second alignment feature 24B of the lithography tool 20, however, may be oriented generally perpendicular to the first alignment feature 14A of the substrate 10 and the first alignment feature 24A of the lithography tool 20. In this configuration, the first alignment feature 14A of the substrate 10 and the first alignment feature 24A of the lithography tool 20 may be used to align the lithography tool 20 and the substrate 10 in the Y direction, and the second alignment feature 14B of the substrate 10 and the second alignment feature 24B of the lithography tool 20 may be used to align the lithography tool 20 and the substrate 10 in the X direction, as discussed below with reference to FIGS. 6A-6C.

The alignment features 14A, 14B of the substrate 10 and the alignment features 24A, 24B of the lithography tool 20 are illustrated in FIGS. 1-5 as having a generally elongated rectangular shape, the alternating dark regions 28 and light regions 29 having a generally rectangular shape. In additional embodiments, the alignment features 14A, 14B of the substrate 10 and the alignment features 24A, 24B of the lithography tool 20 may have other shapes, and the dark regions 28 and light regions 29 need not have a generally rectangular shape. Furthermore, any number of corresponding pairs of alignment features may be provided on the substrate 10 and the lithography tool 20 as necessary or desired.

As previously mentioned, the reference features 14A, 24A may be used to align the lithography tool 20 relative to the substrate 10 in the Y direction, and the reference features 14B, 24B may be used to align the lithography tool 20 relative to the substrate 10 in the X direction.

Figure 6A:
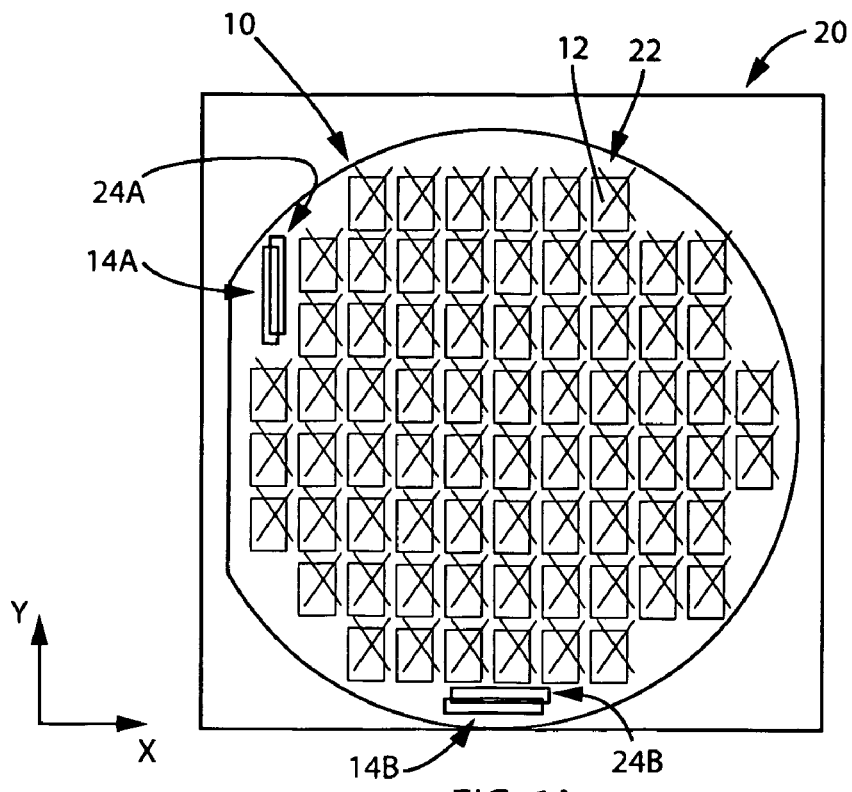
FIGS. 6A-6C illustrate one example of a method that embodies teachings of the present invention and that may be used to align a lithography tool with a substrate.

Referring to FIG. 6A, the lithography tool 20 may be positioned over the substrate 10 and roughly aligned therewith such that the reference feature 24A of the lithography tool 20 at least partially overlaps the reference feature 14A of the substrate 10. After this initial rough alignment, the features 22 in or on the lithography tool 20 may be misaligned with the devices 12 on the substrate 10 in both the X and Y directions, as shown in FIG. 6A. A beam of electromagnetic radiation (not shown) may be caused to interact with both the optical grating 26 of the first alignment feature 24A of the lithography tool 20 and the optical grating 16 of the first alignment feature 14A of the substrate 10 to generate a Moiré pattern similar to that shown in FIG. 5. The relative position between the lithography tool 20 and the substrate 10 may be adjusted in the Y direction and the appearance of the Moiré pattern and location of the Moiré fringes 34 (FIG. 5) therein may be observed (in a manual process by a person, or in an at least partially automated process using a system, as described in further detail below). The relative position between the lithography tool 20 and the substrate 10 may be adjusted until the Moiré fringes 34 (FIG. 5) are located at predetermined locations within the Moiré pattern representing proper alignment between the lithography tool 20 and the substrate 10 in the Y direction.

Figure 6B:
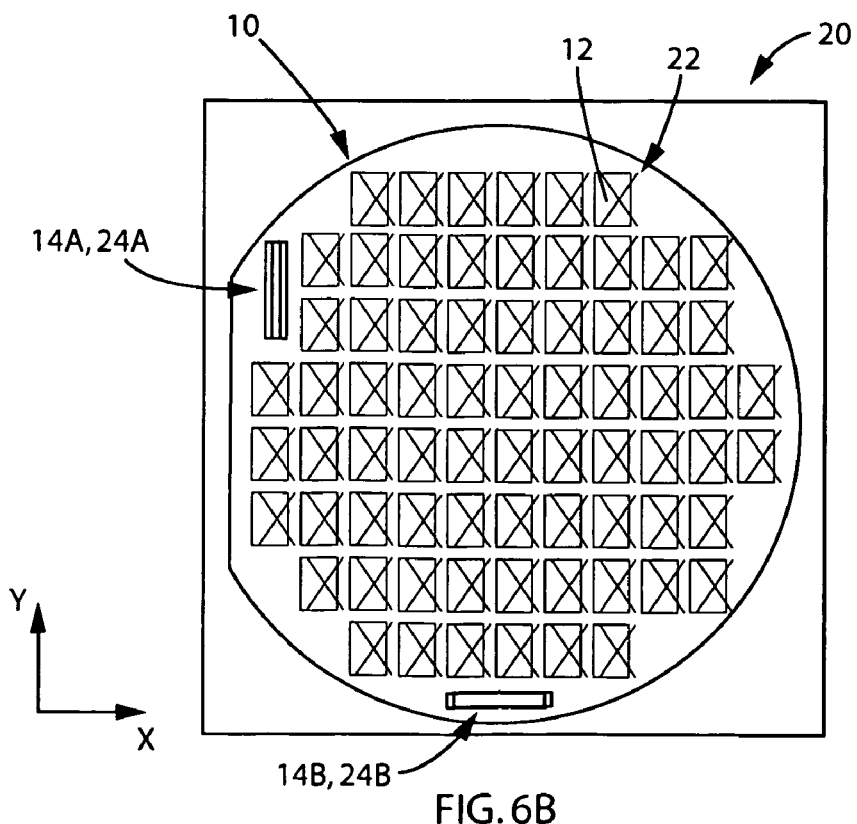

FIG. 6B illustrates one example of a relative position between the lithography tool 20 and the substrate 10 that may be attained after aligning the lithography tool 20 and the substrate 10 in the Y-direction using the reference features 14A, 24A, as described above in relation to FIG. 6A. As shown in FIG. 6B, the features 22 in or on the lithography tool 20 may be substantially aligned with the devices 12 of the substrate 10 in the Y direction, but misaligned therewith in the X direction.

To provide alignment in the X direction, a beam of electromagnetic radiation (not shown) may be caused to interact with both an optical grating 26 of the second reference feature 24B of the lithography tool 20 and an optical grating 16 of the second reference feature 14B of the substrate 10 to generate a Moiré pattern similar to that shown in FIG. 5. The relative position between the lithography tool 20 and the substrate 10 may be adjusted in the X direction and the appearance of the Moiré pattern and location of the Moiré fringes 34 (FIG. 5) therein may be observed (in a manual process by a person, or in an at least partially automated process using a computer, as described in further detail below). The relative position between the lithography tool 20 and the substrate 10 may be adjusted until the Moiré fringes 34 (FIG. 5) are located at predetermined locations within the Moiré pattern representing proper alignment between the lithography tool 20 and the substrate 10 in the X direction.

Figure 6C:
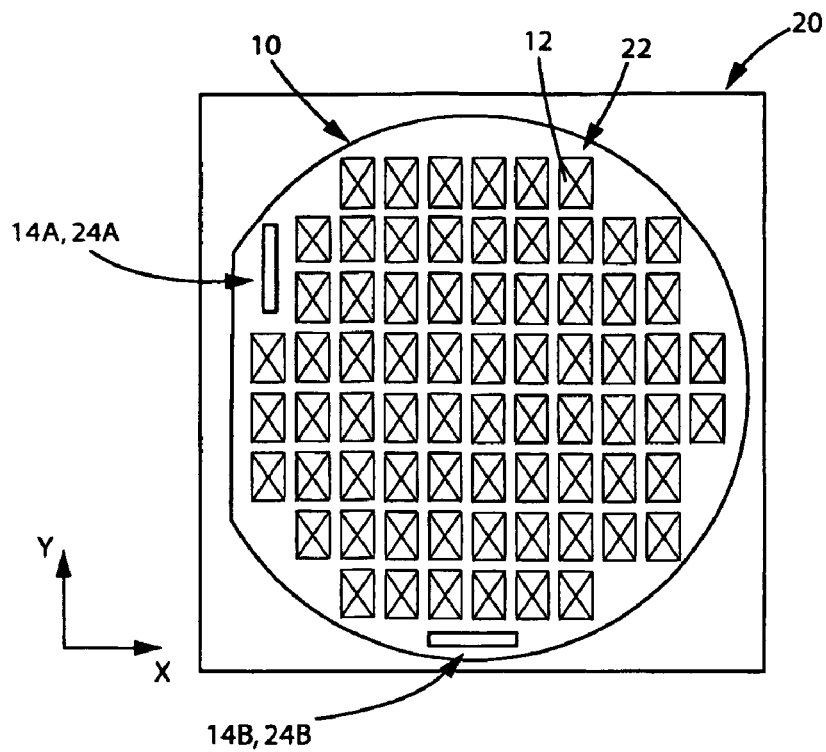

After aligning the lithography tool 20 with the substrate 10 in the Y direction (using the first alignment features 14A, 24A) and the X direction (using the second alignment features 14B, 24B), the features 22 in or on the lithography tool 20 may be substantially aligned with the devices 12 on the substrate 10 in both the X and Y directions, as shown in FIG. 6C. The process of aligning the lithography tool 20 with the substrate 10 in the Y direction (as described with reference to FIG. 6A) and the process of aligning the lithography tool 20 with the substrate 10 in the X direction (as described with reference to FIG. 6B) may be carried out sequentially or substantially simultaneously.

In additional embodiments of the present invention, the first and second alignment features 14A, 14B of the substrate 10 and the first and second alignment features 24A, 24B of the lithography tool 20 may include optical gratings that are configured to generate other types of geometric interference patterns (instead of, or in addition to, Moiré interference patterns) that also may be used to align the lithography tool 20 and the substrate 10. Examples of such optical gratings are described below with reference to FIGS. 7-18.

Figure 7:
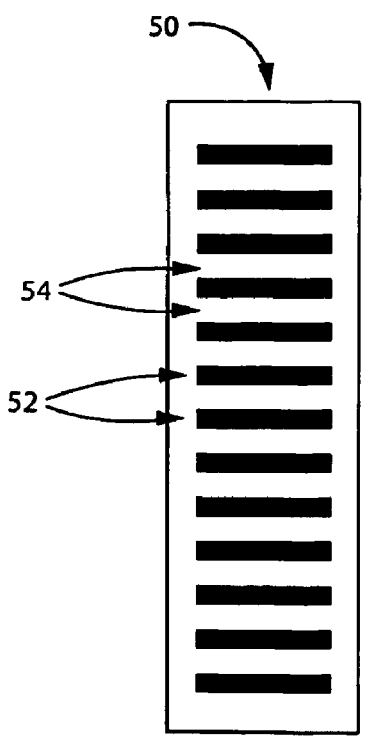
FIG. 7 is an enlarged simplified representation of another example of an optical grating that may be used as an alignment feature of the substrate shown in FIG. 1 or the lithography tool shown in FIG. 2.
Figure 8:
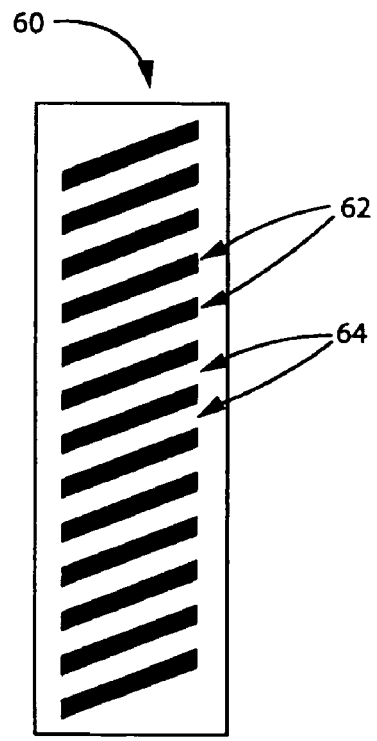
FIG. 8 is an enlarged simplified representation of another example of an optical grating that may be used as an alignment feature of the substrate shown in FIG. 1 or the lithography tool shown in FIG. 2.

FIG. 7 is an enlarged, simplified representation of another embodiment of an optical grating 50 that may be used in each of the first alignment feature 14A and the second alignment feature 14B of the substrate 10 shown in FIG. 1. Similarly, FIG. 8 is an enlarged, simplified representation of another embodiment of an optical grating 60 that may be used in each of the first alignment feature 24A and the second alignment feature 24B of the lithography tool 20 shown in FIG. 2. Of course, in additional embodiments, the optical grating 50 may be used in each of the alignment features 24A, 24B of the lithography tool 20, and the optical grating 60 may be used in each of the alignment features 14A, 14B of the substrate 10.

As shown in FIGS. 7-8, the optical grating 50 includes a plurality of alternating dark regions 52 and light regions 54, and the optical grating 60 includes a plurality of alternating dark regions 62 and light regions 64. By way of example and not limitation, the alternating dark regions 52 and light regions 54 of the optical grating 50 (FIG. 7) may have a generally elongated rectangular shape. The alternating dark regions 52 and light regions 54 of the optical grating 50 (FIG. 8) also may have generally rectangular shapes (for example, elongated rhombuses (or elongated equilateral parallelograms)), as shown in FIG. 8, that are substantially similar to the alternating dark regions 52 and light regions 54 of the optical grating 50, but oriented at an angle thereto. In this configuration, when the lithography tool 20 is positioned over the substrate 10 and roughly aligned therewith such that the reference feature 24A of the lithography tool at least partially overlaps the reference feature 14A of the substrate 10 and a beam of electromagnetic radiation is caused to interact with both the optical grating 50 and the optical grating 60, the optical gratings 50, 60 may generate a geometric interference pattern similar to that shown in FIG. 9. To align the lithography tool 20 and the substrate 10 using the geometric interference pattern, the lithography tool 20 and the substrate 10 may be moved relative to one another (in the vertical direction of FIG. 9) while monitoring or tracking one or more features or characteristics of the interference pattern, as discussed in further detail below.

Figure 9:
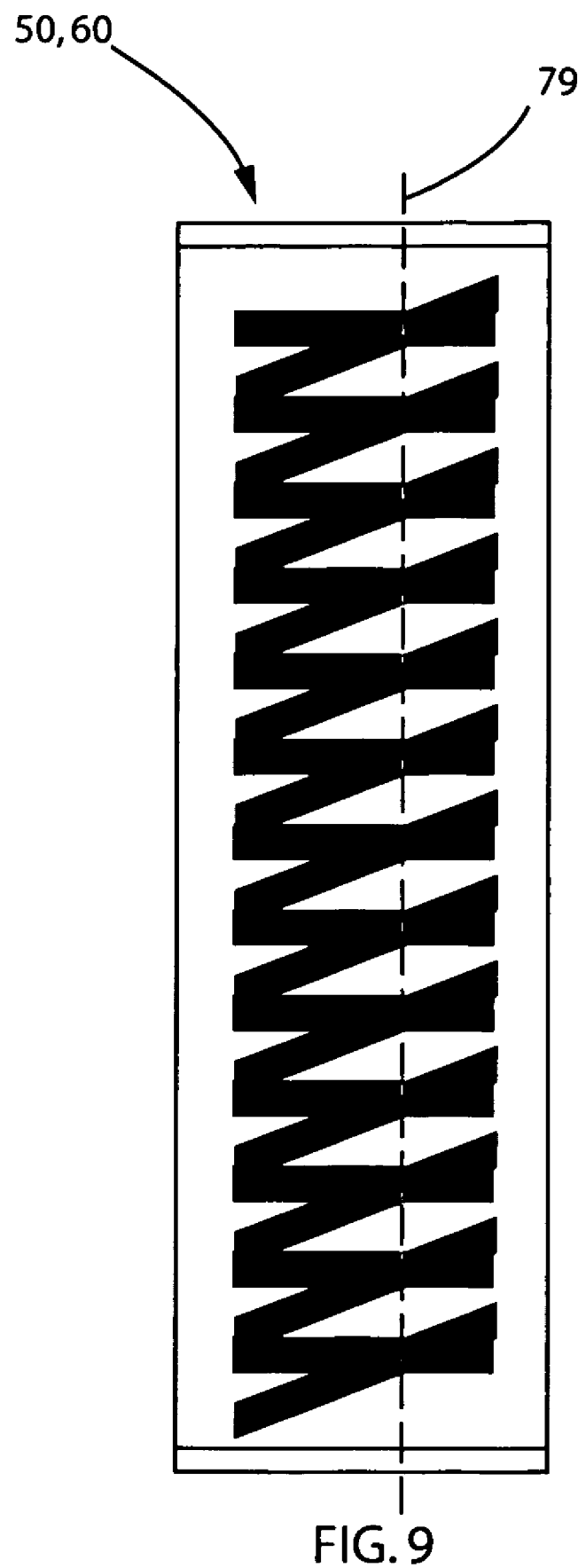
FIG. 9 is an enlarged simplified representation of an interference pattern that may be generated by overlapping the optical grating shown in FIG. 7 and the optical grating shown in FIG. 8 and causing electromagnetic radiation to interact with both of the optical gratings.
Figure 10:
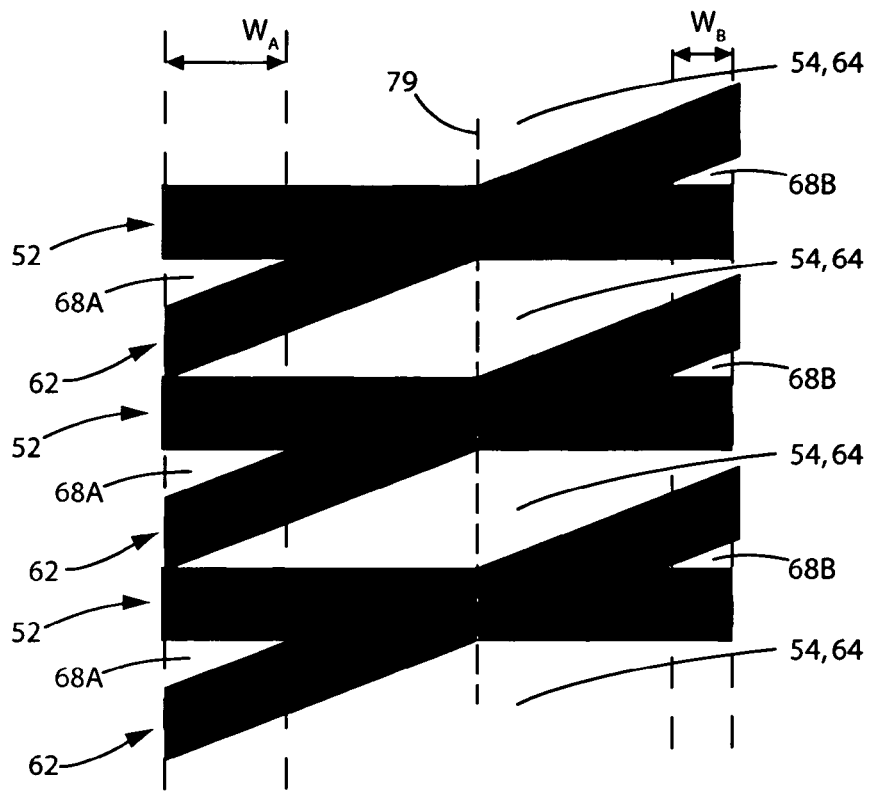
FIG. 10 is an enlarged view of a portion of the interference pattern shown in FIG. 9.

FIG. 10 is an enlarged view of a portion of FIG. 9 illustrating the interference pattern generated by the area of overlap between a segment of the optical grating 50 comprising three dark regions 52 and a segment of the optical grating 60 comprising three dark regions 62. As shown in FIG. 10, the interference pattern may include a first plurality of substantially identical geometric shapes comprising right triangles 68A on one side of the geometric interference pattern, and a second plurality of geometric shapes comprising substantially identical right triangles 68B on an opposite side of the geometric interference pattern. The triangles 68A, 68B may be defined by at least a portion of the area of overlap between a light region 54 of the optical grating 50 and a light region 64 of the optical grating 60. As shown in FIG. 10, the triangles 68A may have a width $W_A$ (or height, depending on the perspective) and the triangles 68B may have a width $W_B$. After only rough alignment between the lithography tool 20 and the substrate 10, the width $W_A$ of the triangles 68A may be greater than the width $W_B$ of the triangles 68B (or visa versa), as also shown in FIG. 10.

As the optical grating 50 of the first alignment feature 14A and the optical grating 60 of the lithography tool 20 are moved relative to one another in the Y direction shown in FIG. 5, the width $W_A$ of the triangles 68A and the width $W_B$ of the triangles 68B may vary.

Figure 11:
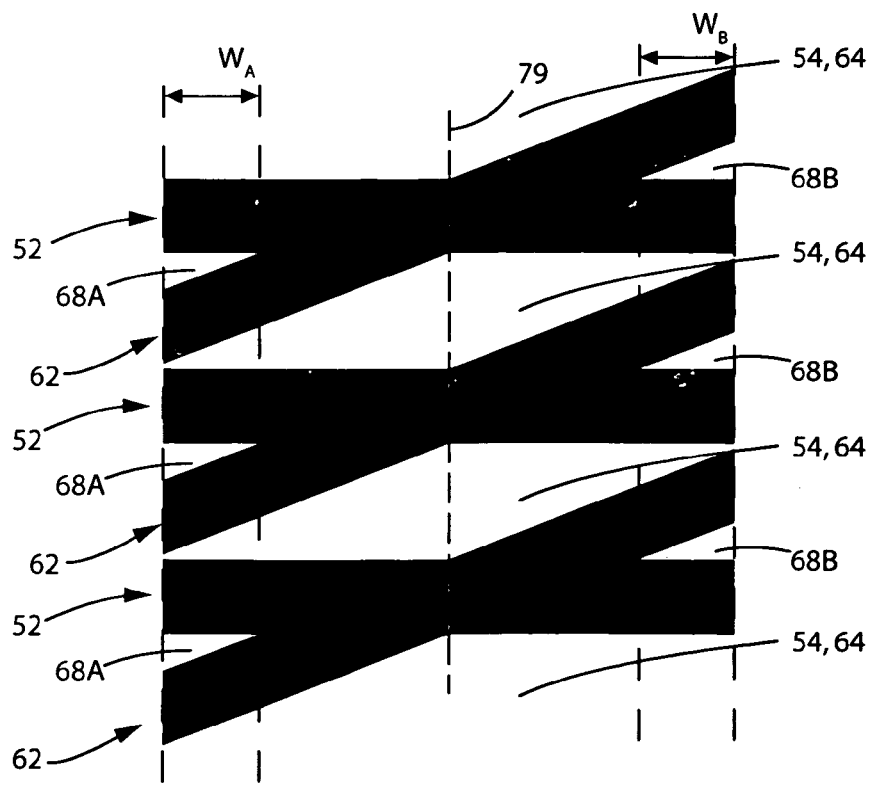
FIG. 11 illustrates the portion of the interference pattern shown in FIG. 10 after adjusting the relative position between the optical grating shown in FIG. 7 and the optical grating shown in FIG. 8.

FIG. 11 is substantially similar to FIG. 10, but illustrates the interference pattern shown therein after moving the optical grating 50 and the optical grating 60 relative to one another in the vertical direction of FIG. 10. By way of example and not limitation, the optical grating 50 and the optical grating 60 may be configured such that the lithography tool 20 is properly aligned relative to the substrate 10 in the Y direction (FIG. 5) when each dark region 62 of the optical grating 60 at least partially overlaps at least one dark region 52 of the optical grating 50, and the ratio of the width $W_A$ to the width $W_B$ is greater than a predetermined minimum value and less than a predetermined maximum value (e.g., the width $W_A$ of the triangles 68A is substantially equal to the width $W_B$ of the triangles 68B, as shown in FIG. 11).

In additional embodiments, the dark regions 52 and light regions 54 of the optical grating 50 and the dark regions 62 and light regions 64 of the optical grating 60 may have shapes other than those shown in the figures, and the geometric shapes generated in the interference pattern that are used to align the lithography tool may have shapes other than triangles.

Any geometrical feature of characteristic of the interference pattern shown in FIG. 9 may be monitored during an alignment process, including features or characteristics other than the triangles 68A, 68B. For example, referring again to FIG. 9, the location in the interference pattern at which the dark regions 52 and the dark regions 62 substantially overlap one another, as represented in FIG. 9 by the dashed line 79, may be monitored during an alignment process. As the optical grating 50 and the optical grating 60 are moved relative to one another in the vertical direction of FIG. 9, the locations defining the dashed line 79 may shift across the interference pattern in the lateral direction of FIG. 9. In some embodiments, the optical grating 50 and the optical grating 60 may be configured such that the lithography tool 20 is properly aligned relative to the substrate 10 in the Y direction (FIG. 5) when the locations defining the dashed line 79 are approximately centered in the lateral direction within the interference pattern, as shown in FIG. 11.

Figure 12:
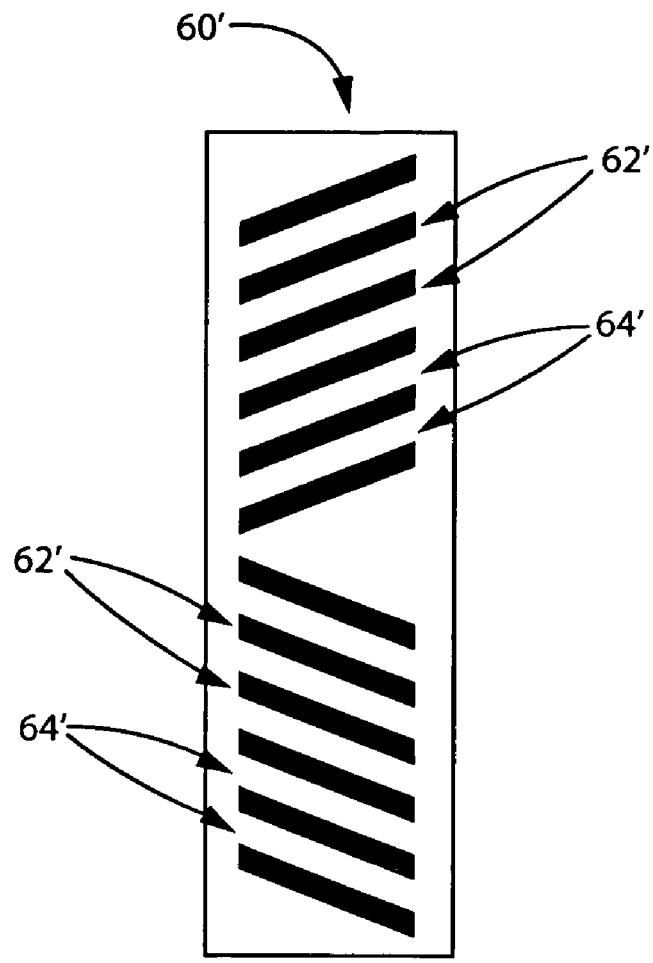
FIG. 12 is an enlarged simplified representation of another example of an optical grating that may be used as an alignment feature of the substrate shown in FIG. 1 or the lithography tool shown in FIG. 2.

FIG. 12 is an enlarged, simplified representation of another embodiment of an optical grating 60' that may be used in each of the first alignment feature 24A and the second alignment feature 24B of the lithography tool 20 shown in FIG. 2 (or in each of the first alignment feature 14A and the second alignment feature 14B of the substrate 10 shown in FIG. 1) as an alternative to the optical grating 60 shown in FIG. 8. As shown in FIG. 14, the optical grating 60' includes a plurality of alternating dark regions 62' and light regions 64' that are substantially identical to the alternating dark regions 60 and light regions 64 (FIG. 8). In the optical grating 60', however, approximately one half of the alternating dark regions 62' and light regions 64' are sloped in one direction and approximately the other half of the alternating dark regions 62' and light regions 64' are sloped in a second generally opposite direction. For example, as shown in FIG. 12, the alternating dark regions 62' and light regions 64' shown in the upper half of FIG. 12 slope in a general direction extending from the lower left to the upper right of FIG. 12, while the alternating dark regions 62' and light regions 64' shown in the lower half of FIG. 12 slope in a general direction extending from the upper left to the lower right of FIG. 12. In this configuration, when the lithography tool 20 (FIG. 2) is positioned over the substrate 10 (FIG. 1) and roughly aligned therewith, such that the reference feature 24A of the lithography tool 20 at least partially overlaps the reference feature 14A of the substrate 10 and a beam of electromagnetic radiation is caused to interact with both the optical grating 50 and the optical grating 60', the optical gratings 50, 60' may generate a geometric interference pattern similar to that shown in FIG. 13. The lithography tool 20 and the substrate 10 then may be aligned in a manner substantially identical to that previously described with reference to FIGS. 10-11. By providing the alternating dark regions 62' and light regions 64' that slope in different directions, the sensitivity of the geometric interference pattern may be increased.

Figure 13:
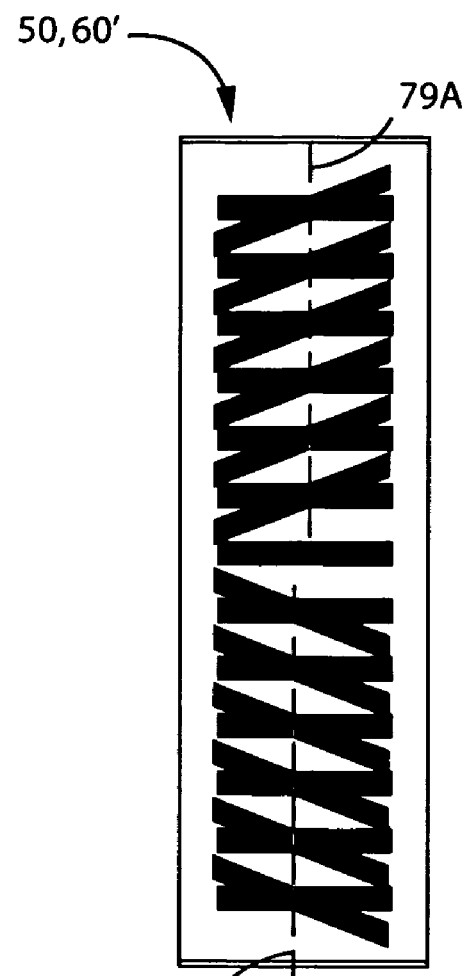
FIG. 13 is an enlarged simplified representation of an interference pattern that may be generated by overlapping the optical grating shown in FIG. 12 and the optical grating shown in FIG. 7 and causing electromagnetic radiation to interact with both of the optical gratings.
Figure 14:
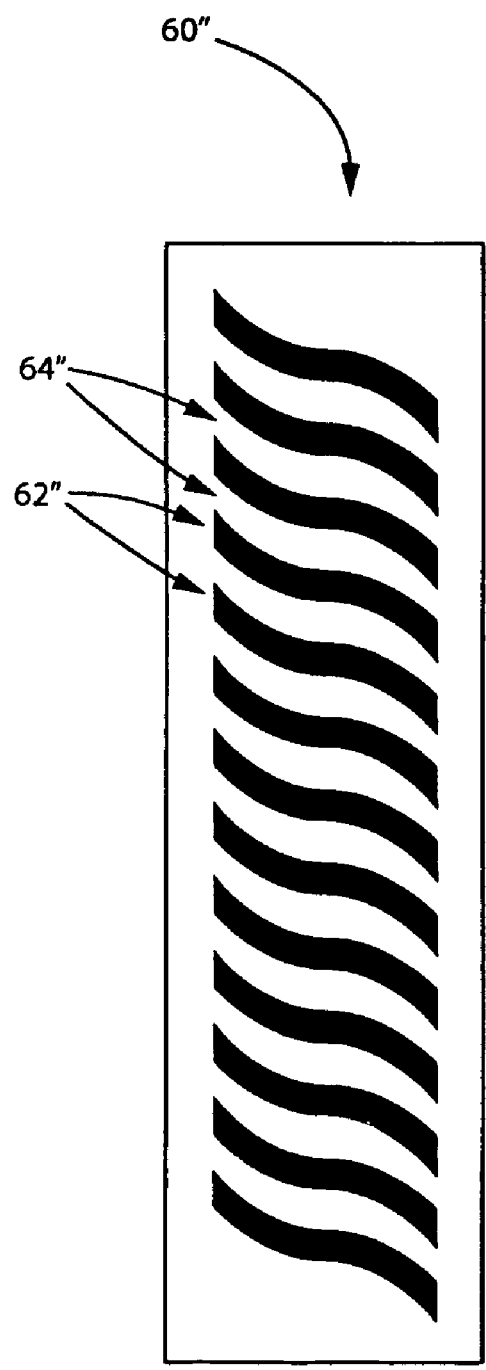
FIG. 14 is an enlarged simplified representation of yet another example of an optical grating that may be used as an alignment feature of the substrate shown in FIG. 1 or the lithography tool shown in FIG. 2.

As previously described, any geometrical feature of characteristic of the interference pattern shown in FIG. 13 may be monitored during an alignment process. For example, the location in the interference pattern at which the dark regions 52 (FIG. 7) and the dark regions 62' (FIG. 12) substantially overlap one another, as represented in FIG. 13 by the dashed lines 79A and 79B, may be monitored during an alignment process. As the optical grating 50 and the optical grating 60' are moved relative to one another in the vertical direction of FIG. 13, the locations defining the dashed lines 79A, 79B may shift across the interference pattern in the lateral directions of FIG. 13. In some embodiments, the optical grating 50 and the optical grating 60' may be configured such that the lithography tool 20 is properly aligned relative to the substrate 10 in the Y direction (FIG. 5) when the locations defining the dashed line 79A are approximately laterally aligned with the locations defining the dashed line 79B in the interference pattern.

FIG. 14 is an enlarged, simplified representation of another embodiment of an optical grating 60" that may be used in each of the first alignment feature 24A and the second alignment feature 24B of the lithography tool 20 shown in FIG. 2 (or in each of the first alignment feature 14A and the second alignment feature 14B of the substrate 10 shown in FIG. 1) as an alternative to the optical grating 60 shown in FIG. 8. As shown in FIG. 14, the optical grating 60" includes a plurality of alternating dark regions 62" and light regions 64". By way of example and not limitation, the alternating dark regions 62" and light regions 64" of the optical grating 60" (FIG. 14) each may have a curved or bent shape. For example, one side of each of the alternating dark regions 62" and light regions 64" may bend or curve in a first direction, and an opposite side of each of the alternating dark regions 62" and light regions 64" may bend in a second, opposite direction to form a shape similar to the shape of the letter S, as shown in FIG. 14. In this configuration, when the lithography tool 20 (FIG. 2) is positioned over the substrate 10 (FIG. 1) and roughly aligned therewith, such that the reference feature 24A of the lithography tool at least partially overlaps the reference feature 14A of the substrate 10 and a beam of electromagnetic radiation is caused to interact with both the optical grating 50 and the optical grating 60", the optical gratings 50, 60" may generate a geometric interference pattern similar to that shown in FIG. 15.

Figure 15:
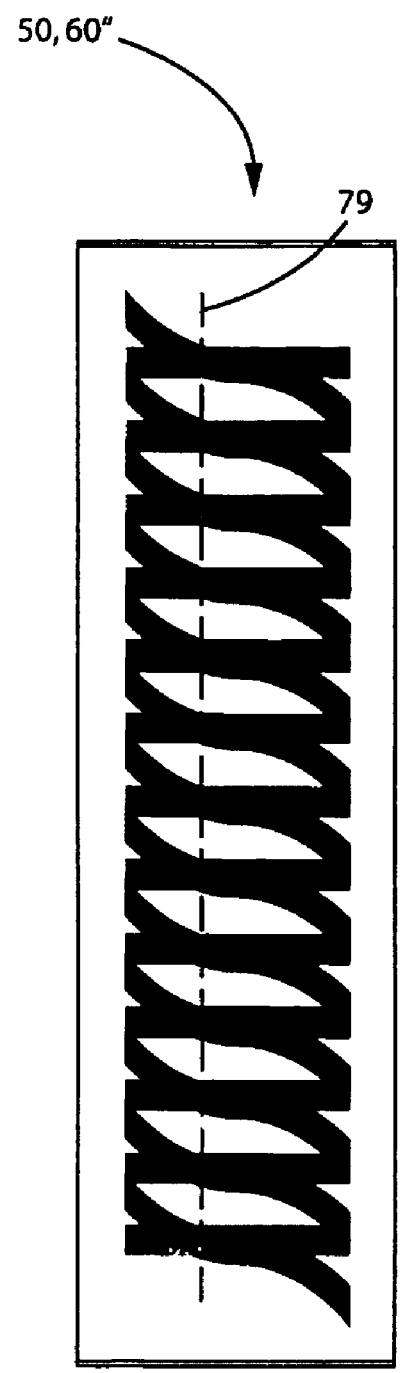
FIG. 15 is an enlarged simplified representation of an interference pattern that may be generated by overlapping the optical grating shown in FIG. 14 and the optical grating shown in FIG. 7 and causing electromagnetic radiation to interact with both of the optical gratings.
Figure 16:
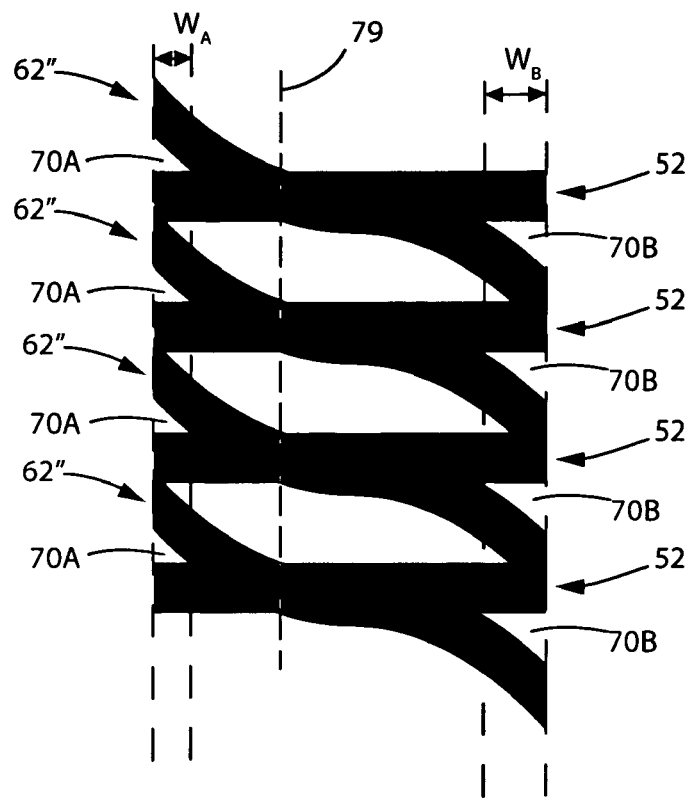
FIG. 16 is an enlarged view of a portion of the interference pattern shown in FIG. 15.

FIG. 16 is an enlarged view of a portion of FIG. 15 illustrating the geometric interference pattern generated by the area of overlap between a segment of the optical grating 50 comprising four dark regions 52 and a segment of the optical grating 60" comprising three dark regions 62". As shown in FIG. 16, the geometric interference pattern may include a first plurality of generally triangular shapes 70A on one side of the interference pattern, and a second plurality of generally triangular shapes 70B on an opposite side of the interference pattern. As shown in FIG. 16, the triangular shapes 70A and the triangular shapes 70B each may be similar to a right triangle having a curved hypotenuse. The triangular shapes 70A, 70B each may be defined by at least a portion of the area of overlap between a light region 54 of the optical grating 50 and a light region 64" of the optical grating 60". As shown in FIG. 16, the triangular shapes 70A may have a width $W_A$ (or height, depending on the perspective) and the triangular shapes 70B may have a width $W_B$. After only rough alignment between the lithography tool 20 and the substrate 10, the width $W_A$ of the triangular shapes 70A may be less than the width $W_B$ of the triangular shapes 70B (or visa versa), as also shown in FIG. 16.

As the optical grating 50 of the first alignment feature 14A of the substrate 10 and the optical grating 60" of the first alignment feature 24A of the lithography tool 20 are moved relative to one another in the Y direction shown in FIG. 5, the width $W_A$ of the triangular shapes 70A and the width $W_B$ of the triangular shapes 70B may vary.

Figure 17:
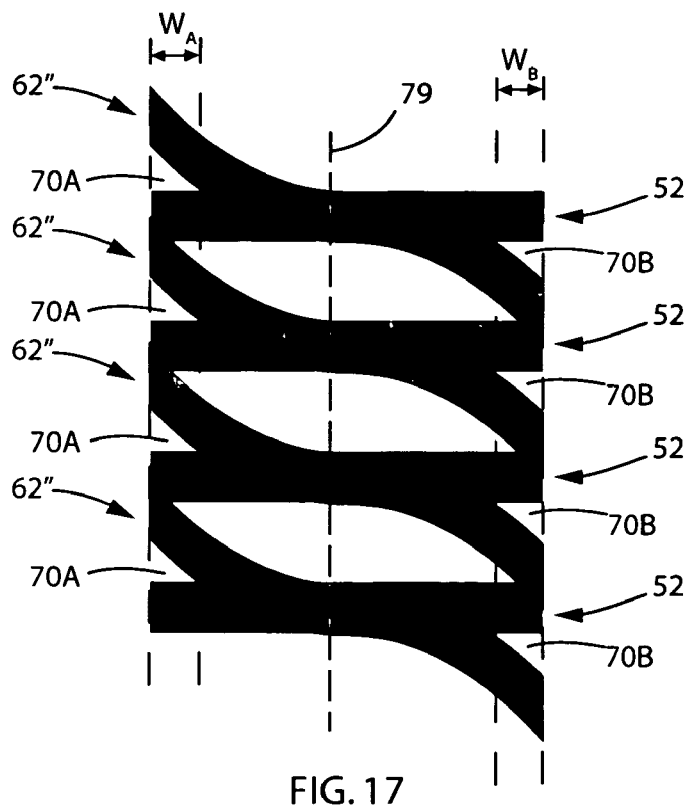
FIG. 17 illustrates the portion of the interference pattern shown in FIG. 16 after adjusting the relative position between the optical grating shown in FIG. 14 and the optical grating shown in FIG. 7.

By way of example and not limitation, the optical grating 50 and the optical grating 60" may be configured such that the lithography tool 20 is properly aligned relative to the substrate 10 in the Y direction (FIG. 5) when each dark region 62" at least partially overlaps at least one dark region 52, and the ratio of the width $W_A$ of the generally triangular shapes 70A to the width $W_B$ of the generally triangular shapes 70B is approximately equal to one (1) (e.g., the width $W_A$ of the triangular shapes 70A is substantially equal to the width $W_B$ of the triangular shapes 70B), as shown in FIG. 17.

In general, for an incremental shift $dy_{OG}$ in the relative position between the optical grating 50 (OG) of the alignment feature 14A and the optical grating 60" of the alignment feature 24A in the Y direction, the corresponding incremental shift $dW_A$ in the width of the triangular shapes 70A and the corresponding incremental shift $dW_B$ in the width of the triangular shapes 70B may vary depending on the relative position between the optical grating 50 (OG) of the alignment feature 14A of the substrate 10 and the optical grating 60" of the alignment feature 24A of the lithography tool 20. In other words, if the relative position between the substrate 10 and the lithography tool 20 is adjusted in the Y direction at a constant first rate, the width $W_A$ of the triangular shapes 70A and the width $W_B$ of the triangular shapes 70B may each change with a varying rate. The sensitivity of the geometric interference pattern shown in FIG. 16 may be defined as the greater of the ratio of the incremental shift $dW_A$ to the incremental shift $dy_{OG}$ ($dW_A/dy_{OG}$) and the ratio of the incremental shift $dW_B$ to the incremental shift $dY_{OG}$ ($dW_B/dy_{OG}$).

In the embodiment described above, the optical grating 50 and the optical grating 60" may be configured such that the geometric interference pattern has a pattern sensitivity that increases as the substrate 10 and the lithography tool 20 become more properly aligned (i.e., the relative position between the substrate 10 and the lithography tool 20 is adjusted towards a predetermined alignment position). In some embodiments, the pattern sensitivity of the geometric interference pattern may increase continuously (linearly or nonlinearly) as the lithography tool 20 becomes more closely aligned with the substrate 10. In this configuration, the geometric interference pattern may be used for both relatively rough and relatively fine alignment between the lithography tool 20 and the substrate 10.

Figure 18:
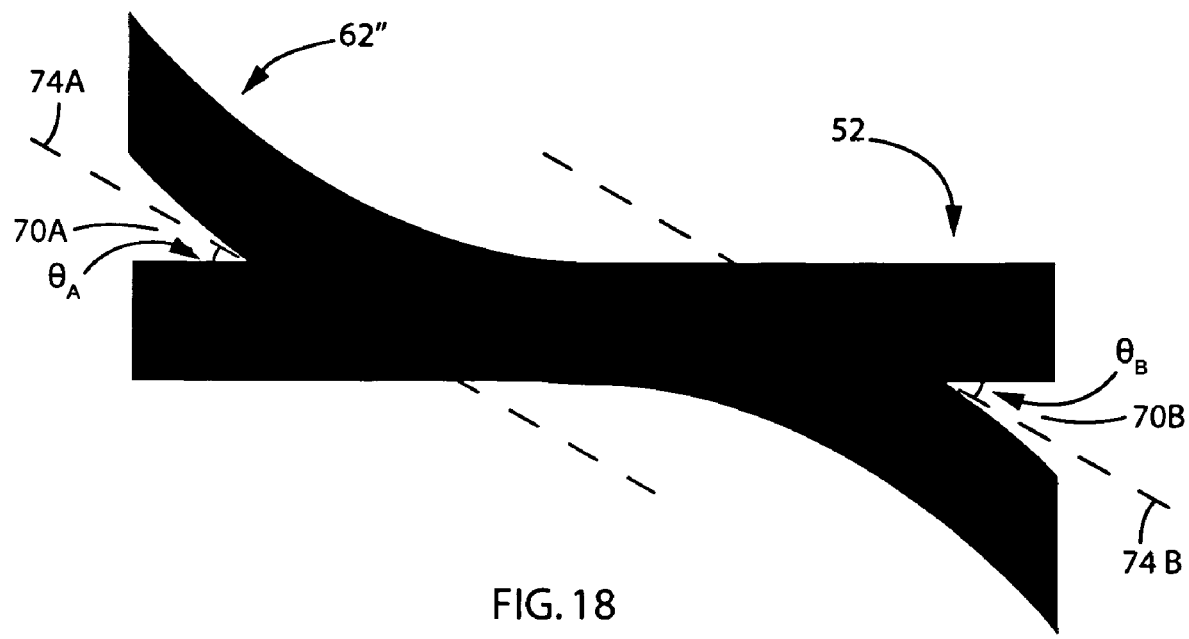
FIG. 18 is a yet further enlarged view of a portion of the interference pattern shown in FIG. 17.

FIG. 18 is a yet further enlarged view of a portion of FIG. 17 illustrating one dark region 52 of the optical grating 50 overlapping one dark region 62" of the optical grating 60". The pattern sensitivity of the geometric interference pattern may be at least partially a function of the angles $\theta_A$ associated with the generally triangular shapes 70A (defined between the dark regions 52 of the optical grating 50 and the lines 74A tangent to the adjacent dark regions 62" of the optical grating 60" at the points of intersection between the dark regions 52 and the adjacent dark regions 62") and the angles $\theta_B$ associated with the generally triangular shapes 70B (defined between the dark regions 52 of the optical grating 50 and the lines 74B tangent to the adjacent dark regions 62" of the optical grating 60" at the points of intersection between the dark regions 52 and the adjacent dark regions 62"). The pattern sensitivity of the geometric interference pattern may be relatively high when either the angles $\theta_A$ or the angles $\theta_B$ are closer to zero degrees (0°) and relatively low when either the angles $\theta_A$ or the angles $\theta_B$ are closer to ninety degrees (90°). By selectively tailoring the curvature of the dark regions 62" of the optical grating 60" (and, hence, the curvature of the curved "hypotenuses" of the generally triangular shapes 70A and the generally triangular shapes 70B) the variation in the pattern sensitivity of the geometric interference pattern may be selectively tailored to provide a relatively lower predetermined selected pattern sensitivity when the lithography tool 20 (FIG. 2) is not properly aligned with the substrate 10 (FIG.

1) and a relatively higher predetermined selected pattern sensitivity when the lithography tool 20 is more closely aligned with the substrate 10.

In additional embodiments, the dark regions 52 and light regions 54 of the optical grating 50 and the dark regions 62" and light regions 64" of the optical grating 60" may have shapes other than those shown in the figures, and the geometric shapes generated by the geometric interference pattern that are used to align the lithography tool may have shapes other than generally triangular shapes.

Any geometrical feature of characteristic of the interference pattern shown in FIG. 15 may be monitored during an alignment process, including features or characteristics other than the generally triangular shapes 70A, 70B. For example, referring again to FIG. 15, the location in the interference pattern at which the dark regions 52 (FIG. 7) and the dark regions 62" (FIG. 14) substantially overlap one another, as represented in FIG. 15 by the dashed line 79, may be monitored during an alignment process. As the optical grating 50 and the optical grating 60" are moved relative to one another in the vertical direction of FIG. 15, the locations defining the dashed line 79 may shift across the interference pattern in the lateral direction of FIG. 15. In some embodiments, the optical grating 50 and the optical grating 60" may be configured such that the lithography tool 20 is properly aligned relative to the substrate 10 in a particular direction when the locations defining the dashed line 79 are approximately centered in the lateral direction within the interference pattern, as shown in FIG. 17.

Various principles of the present invention are described below with reference to FIGS. 19-22. Such principles may be used to provide or define additional embodiments of optical gratings that may be used to align lithography tools and substrates, such as the lithography tool 20 and the substrate 10) using methods that embody teachings of the present invention.

Figure 19:
FIGS. 19-22 are used to illustrate principles of the present invention that may be used to provide or define additional embodiments of optical gratings that may be used to align lithography tools and substrates using methods that embody teachings of the present invention.

A simplified representation of a conventional optical grating is shown in FIG. 19. Conventionally, two such optical gratings are used to generate a Moiré type geometrical interference pattern. For example, a first optical grating (similar to that shown in FIG. 19) having a pitch $\lambda_1$ and a second optical grating (also similar to that shown in FIG. 19) having a pitch $\lambda_2$ may be aligned with one another and used to generate a Moiré pattern, as previously described herein. Each Moiré pattern alternatively may be characterized by the linenumber k (which is analogous to the wavenumber of a wave), which is defined as $2\pi$ radians divided by the pitch. In other words, the linenumber $k_1$ of the first optical grating and the linenumber $k_2$ of the second optical grating may given by Equations 1 and 2 below:

$$k_1 = \frac{2\pi}{\lambda_1} \qquad \text{Equation 1}$$

$$k_2 = \frac{2\pi}{\lambda_2} \qquad \text{Equation 2}$$

It is known in the art that when two such optical gratings are used to generate a Moiré pattern, the Moiré fringes in the Moiré pattern may have a pitch $\lambda_p$ given by Equation 3 below (assuming that $\lambda_2$ is greater than $\lambda_1$).

$$\lambda_p = \frac{\lambda_1 \lambda_2}{\lambda_2 - \lambda_1} \qquad \text{Equation 3}$$

Furthermore, the Moiré fringes in the Moiré pattern may have a linenumber $k_p$ given by Equation 4 below.

$$k_p = \frac{2\pi}{\lambda_p} \qquad \text{Equation 4}$$

Upon substituting Equations 1 through 3 into Equation 4, it can be seen that the linenumber $k_p$ for the Moiré fringes in the Moiré pattern alternatively may be given by Equation 5 below.

$$k_p = k_1 - k_2 \qquad \text{Equation 5}$$

It is also known in the art that the sensitivity of a Moiré pattern may be characterized in terms of a magnification or sensitivity constant $S_p$, which may be defined by Equation 6 below.

$$S_p = \frac{\lambda_p}{\lambda_1} = \frac{|k_1|}{|k_p|} = \frac{k_1}{k_1 - k_2} \qquad \text{Equation 6}$$

The above Equations 1 through 6 describe the conventional one-dimensional Moiré type interference pattern. Other types of geometric interference patterns, however, (such as those shown in FIGS. 9, 13, and 15) may have two-dimensional characteristics. In such situations, Equations 1 through 6 must be adapted to account for such two-dimensional characteristics.

Figure 20:

Referring to FIGS. 19 and 20, the linenumber of the optical grating shown in FIG. 19 may be characterized by a vector $k_1$ (the arrow shown over the $k_1$ in FIG. 19 indicates that $k_1$ is a vector) having a magnitude defined by Equation 1 above and a direction oriented substantially perpendicular to the alternating light and dark regions, as shown in FIG. 19. Similarly, the linenumber of the optical grating shown in FIG. 20 may be characterized by a vector $k_2$ (the arrow shown over the $k_2$ in FIG. 20 indicates that $k_2$ is a vector) having a magnitude defined by Equation 2 above and a direction oriented substantially perpendicular to the alternating light and dark regions, as shown in FIG. 20. Equation 5 above may be adapted to the corresponding two-dimensional vector Equation 7 below to define the vector $k_p$ defining the linenumber for the Moiré fringes in the Moiré pattern formed using the optical gratings shown in FIGS. 19 and 20.

$$\vec{k}_p = \vec{k}_1 - \vec{k}_2 \qquad \text{Equation 7}$$

Figure 21:
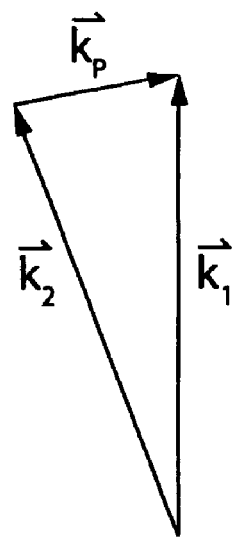

Using principles of vector addition and subtraction, Equation 7 can be represented graphically as shown in FIG. 21. As can be understood with reference to FIG. 21, the magnitude of the vector $k_p$ may be changed by changing the magnitude and/or the direction of one or both of the vectors $k_1$ and $k_2$.

In the two-dimensional scenario, the sensitivity constant $S_p$, is defined by Equation 8 below.

$$S_p = \frac{|\vec{k_1}|}{|\vec{k_p}|}$$ Equation 8

Because the sensitivity constant $S_p$ may be defined as the ratio of the magnitude of the vector $\vec{k_1}$ to the magnitude of the vector $\vec{k_p}$, the sensitivity constant $S_p$ itself is a scalar quantity and not a vector. As can be understood with reference to Equation 8, very small values for the magnitude of the vector $\vec{k_p}$ result in large values for the sensitivity constant $S_p$ (i.e., high magnification or sensitivity of the resulting geometric interference pattern), while very large values for the magnitude of the vector $\vec{k_p}$ result in small values for the sensitivity constant $S_p$ (i.e., low magnification or sensitivity of the resulting geometric interference pattern).

Because the sensitivity constant $S_p$ is a function of the magnitude of the vector $\vec{k_p}$, and the magnitude of the vector $\vec{k_p}$ may be changed by changing the magnitude and/or the direction of one or both of the vectors $k_1$ and $k_2$, the sensitivity of optical gratings that embody teachings of the present invention may be selectively varied or selectively tailored by adjusting the direction of the vectors $k_1$ and $k_2$, in addition to or as an alternative to adjusting the magnitude of the vectors $k_1$ and $k_2$.

Figure 22:

Furthermore, as can be seen with reference to FIG. 22, some optical gratings may have a vector defining the linenumber of the optical grating having a direction that varies across the optical grating. For example, the linenumber of the optical grating shown in FIG. 22 is defined by a vector $K_{2A}$ on the left side of the optical grating, a vector $k_{2B}$ near the center of the optical grating, and a vector $k_{2C}$ near the right side of the optical grating. Of course, the vector representing the linenumber varies continuously across the optical grating shown in FIG. 22. Because the direction of the vector defining the linenumber varies across the optical grating, the sensitivity constant $S_p$ of the geometric interference pattern generated by overlapping the optical gratings shown in FIGS. 19 and 22 also varies across the interference pattern. In this configuration, the geometric interference pattern may be configured for both relatively rough and relatively fine alignment, as previously described herein.

The mathematic and geometrical principles described above in relation to FIGS. 19-22 may be used to derive embodiments of optical gratings other than those illustrated and described herein that also embody teachings of the present invention.

In each of the above described embodiments, the optical gratings of the first and second alignment features 14A, 14B of the substrate 10 (FIG. 1) may be oriented generally parallel to the major surfaces of the substrate 10, and the optical gratings of the first and second alignment features 24A, 24B of the lithography tool 20 (FIG. 2) may be oriented generally parallel to the major surfaces of the lithography tool 20. In this configuration, when the lithography tool 20 is positioned over the substrate 10 for alignment therebetween, as previously described with reference to FIGS. 6A-6C, electromagnetic radiation may be directed at the optical gratings of the first and second alignment features 14A, 14B and the optical gratings of the first and second alignment features 24A, 24B from a position generally above the lithography tool 20 or generally below the substrate 10. In such a configuration, at least a portion of the lithography tool 20 and/or the substrate 10 may be required to be at least partially transparent to the electromagnetic radiation to allow electromagnetic radiation to pass therethrough. The present invention is not so limited, however, and in additional embodiments, the optical gratings may be located generally between the substrate 10 and the lithography tool 20 to allow the electromagnetic radiation to be passed through the optical gratings between the substrate 10 and the lithography tool 20, which may eliminate the requirement that at least a portion of the lithography tool 20 and/or the substrate 10 be at least partially transparent to the electromagnetic radiation.

Figure 23:
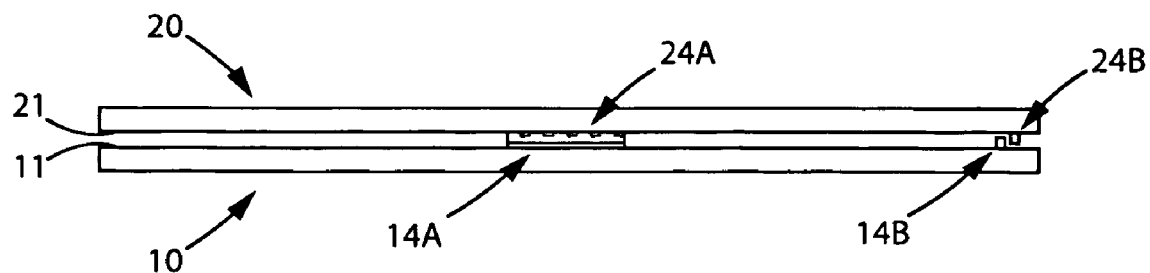
FIG. 23 is a side view of the substrate shown in FIG. 1 and the lithography tool shown in FIG. 2 illustrating additional embodiments of optical gratings that may be used to align the lithography tool and the substrate using methods that also embody teachings of the present invention.

FIG. 23 is a side view of the substrate 10 and the lithography 20 illustrating another embodiment in the present invention. In FIG. 23, the lithography tool 20 is shown positioned over the substrate 10 in a manner similar to that previously described in relation to FIGS. 6A-6C. In the embodiment shown in FIG. 23, the first and second alignment features 14A, 14B of the substrate 10 and the first and second alignment features 24A, 24B of the lithography tool 20 are disposed generally between the substrate 10 and the lithography tool 20.

Figure 24:
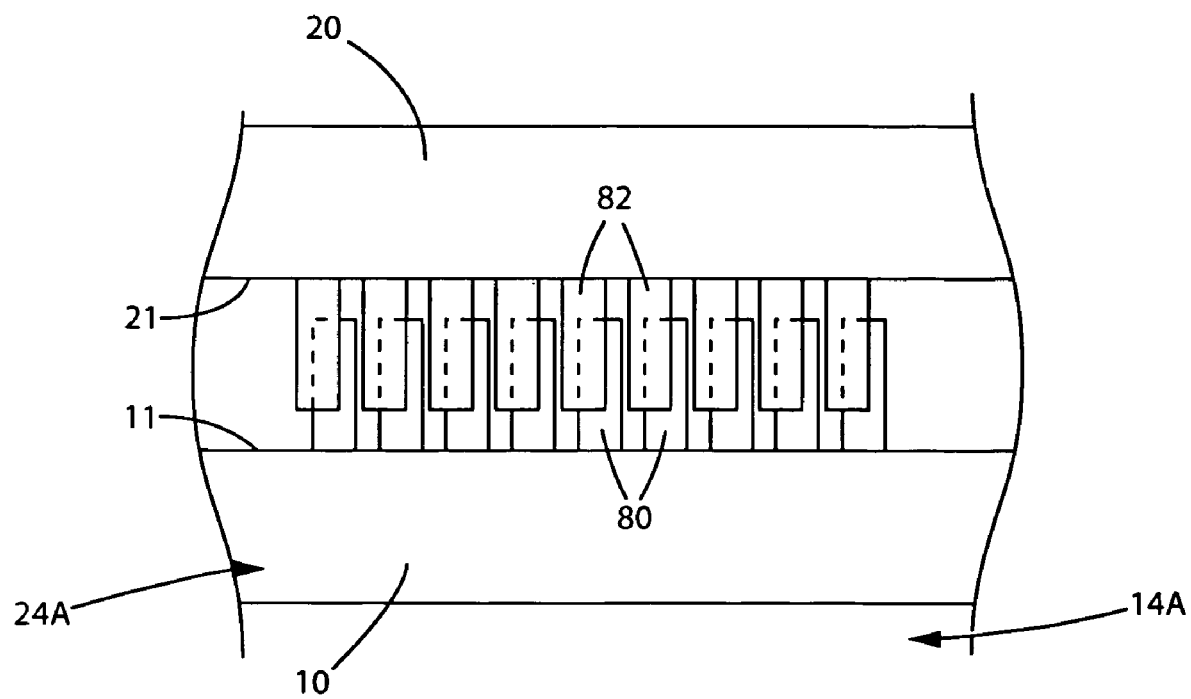
FIG. 24 is an enlarged side view of a portion of the substrate and lithography tool shown in FIG. 23.

FIG. 24 is an enlarged view of a portion of FIG. 23 illustrating the first alignment feature 14A of the substrate 10 and the first alignment feature 24A of the lithography tool 20. As shown in FIG. 24, the first alignment feature 14A of the substrate 10 may comprise a plurality of protrusions 80 that extend from a major surface 11 of the substrate 10 generally towards the lithography tool 20. Similarly, the first alignment feature 24A of the lithography tool 20 may comprise a plurality of protrusions 82 that extend from a major surface 21 of the lithography tool 20 generally towards the substrate 10. The protrusions 80 and the protrusions 82 each may be substantially reflective or opaque over at least a range of wavelengths. In this configuration, the protrusions 80 of the first alignment feature 14A of the substrate 10 may be configured as a first optical grating, and the protrusions 82 of the first alignment feature 24A of the substrate 10 may be configured as a second, corresponding optical grating. By way of example and not limitation, the protrusions 80 may be sized and configured to define an optical grating similar to the optical grating 16 shown in FIG. 3 (the protrusions 80 defining the dark regions 28 and the spaces between the protrusions 80 defining the light regions 29), and the protrusions 82 may be sized and configured to define an optical grating similar to the optical grating 26 shown in FIG. 4 (the protrusions 82 defining the dark regions 28 and the spaces between the protrusions 80 defining the light regions 29).

Figure 25:
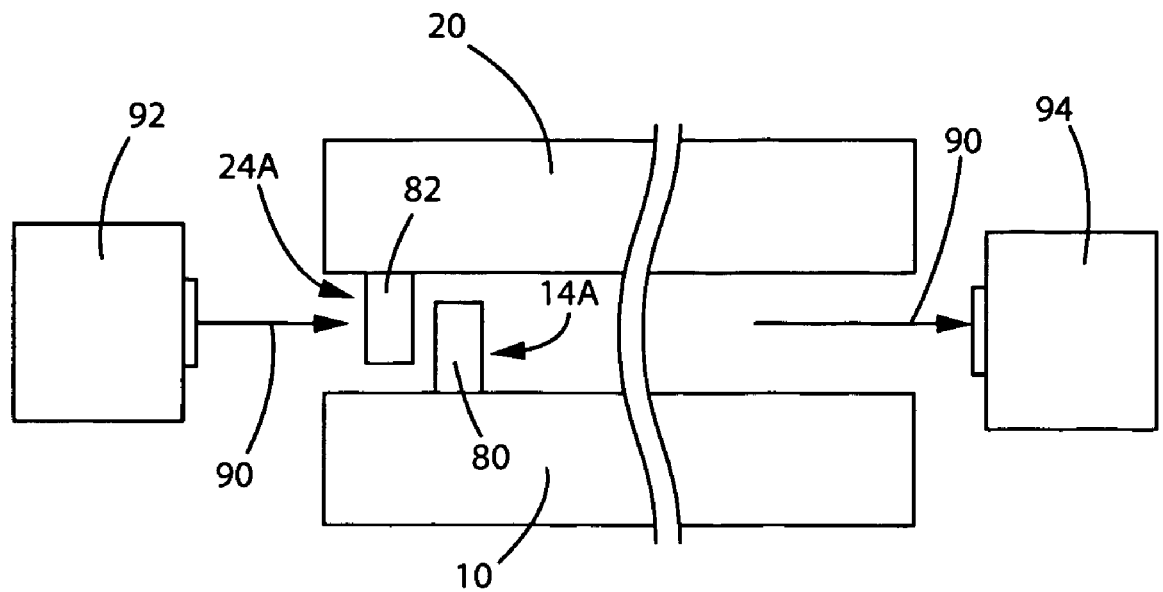
FIG. 25 is another enlarged side view of a portion of the substrate and lithography tool shown in FIG. 23 rotated approximately ninety degrees relative to the perspective of FIG. 24 and further illustrating electromagnetic radiation passing through optical gratings for aligning the substrate and the lithography tool.

FIG. 25 is a side view of the first alignment feature 14A of the substrate 10 and the first alignment feature 24A of the lithography tool 20 rotated approximately ninety degrees (90°) relative to the perspective illustrated in FIG. 24. In this configuration, electromagnetic radiation 90 may be emitted from a radiation source 92 located adjacent a side of the substrate 10 and the lithography tool 20. As the electromagnetic radiation 90 passes through (or otherwise interacts with) the optical grating defined by the protrusions 80 and the optical grating defined by the protrusions 82, a geometric interference pattern (e.g., a Moiré pattern similar to that shown in FIG. 5, or a geometric interference pattern similar to that shown in FIG. 9) may be defined in the electromagnetic radiation 90. The electromagnetic radiation 90 carrying the geometric interference pattern may impinge on and be collected by a radiation detector 94, as shown in FIG. 25. In this embodiment, the electromagnetic radiation 90 may pass between the substrate 10 and the lithography tool 20 without passing through and/or impinging on either the substrate 10 or the lithography tool 20. The detector 94 may be configured to generate an image of the geometric interference pattern, which then may be used to properly align the lithography tool 20 and the substrate 10 as previously described herein in relation to FIGS. 6A-6C.

Figure 26:
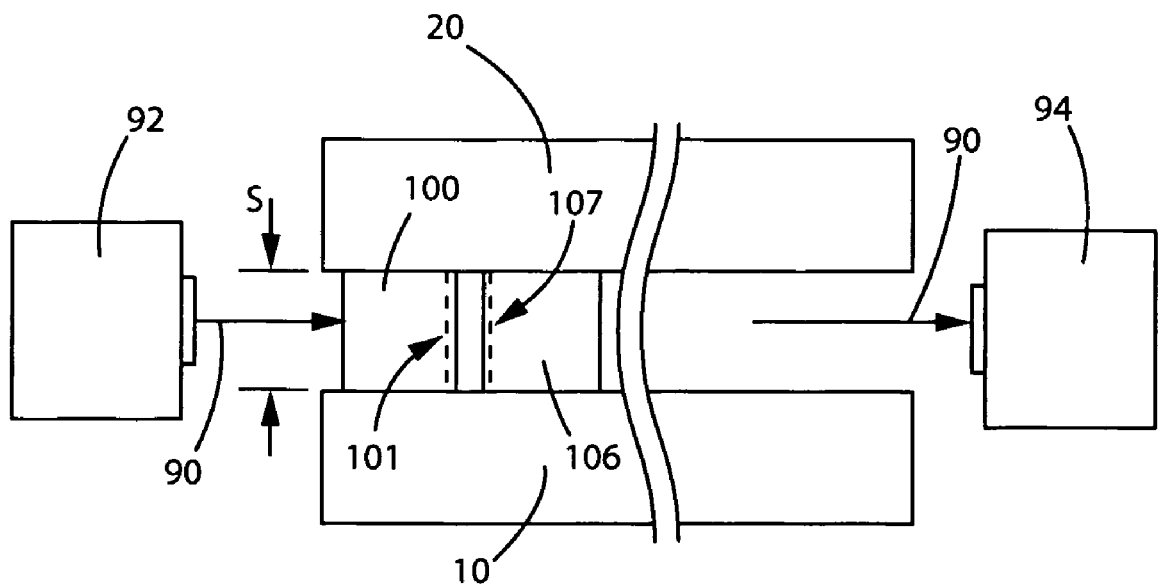
FIG. 26 is an enlarged partial side view of the substrate shown in FIG. 1 and the lithography tool shown in FIG. 2 illustrating additional embodiments of optical gratings that are formed in spacers.

FIG. 26 is a partial side view of the substrate 10 and the lithography 20 illustrating another embodiment in the present invention. In FIG. 26, the lithography tool 20 is shown positioned over the substrate 10 in a manner similar to that previously described in relation to FIGS. 6A-6C. As shown in the embodiment illustrated in FIG. 26, a first spacer 100 and a second spacer 106 may be used to provide a selected stand-off or spacing S between the substrate 10 and the lithography tool 20. By way of example and not limitation, the first spacer 100 may be attached or adhered to the substrate 10, and the second spacer 106 may be attached or adhered to the lithography tool 20. In additional embodiments, the first spacer 100 may be integrally formed with the substrate 10, and the second spacer 106 may be integrally formed with the lithography tool 20.

By way of example and not limitation, the spacers 100, 106 may comprise a ceramic material (e.g., glass) or a polymer material that is substantially transparent to the electromagnetic radiation 90 to allow the electromagnetic radiation 90 to pass therethrough. In this configuration, a first optical grating 101 may be formed on or in a surface of the first spacer 100 and a second optical grating 107 may be formed in a surface of the second spacer 106. The optical gratings 101, 107 in the spacers 100, 106 may be used to align the substrate 10 and the lithography tool 20 in the X and/or Y directions, in a manner substantially similar to that previously described in relation to FIGS. 24-25.

Figure 27:
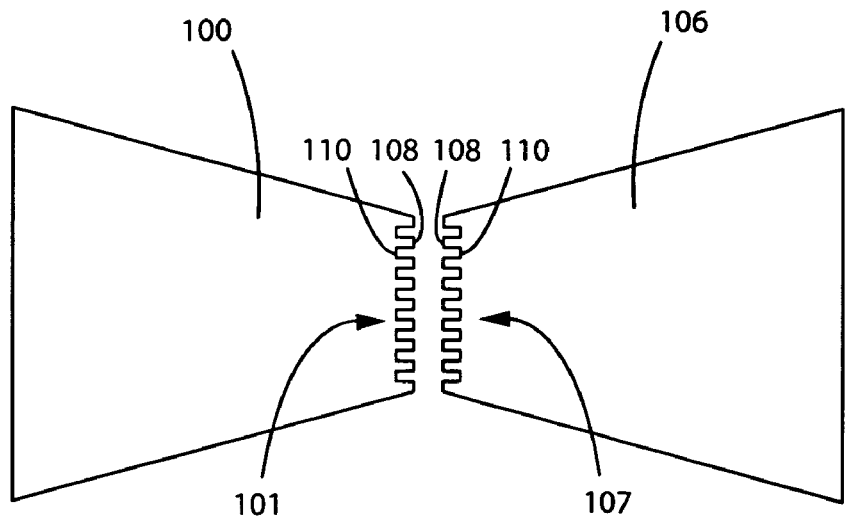
FIG. 27 is a top view of the spacers shown in FIG. 26 illustrating optical gratings formed therein.

FIG. 27 is a top view of the spacers 100, 106 shown in FIG. 26. As shown in FIG. 27, the optical grating 101 of the first spacer 100 may include a plurality of alternating dark regions 102 and light regions 104 formed on or in a surface of the spacer 100. By way of example and not limitation, a coating of absorbent and/or reflective material (not shown) (i.e., material that is configured to absorb and/or reflect the electromagnetic radiation 90 (FIG. 26)) may be deposited on a surface of the spacers 100, 106 on which it is desired to form the optical gratings 101, 107. The absorbent and/or reflective material then may be masked and etched (e.g., wet etched or plasma etched) to selectively remove portions of the absorbent and/or reflective material and form alternating dark regions 108 and light regions 110. The alternating dark regions 108 and light regions 110 may be configured of the optical gratings 101, 107 may be sized and configured to generate a geometric interference pattern when the electromagnetic radiation 90 (FIG. 26) is caused to interact with both the optical grating 101 and the optical grating 107 (e.g., the electromagnetic radiation 90 (FIG. 26) is caused to pass through the spacers 100, 106 and the optical gratings 101, 107). By way of example and not limitation, the first optical grating 101 may be configured substantially similar to the optical grating 16 previously described in relation to FIG. 3, and the optical grating 107 may be configured substantially similar to the optical grating 26 previously described in relation to FIG. 4.

In some embodiments of the present invention, the spacers 100, 106 may have a size and shape configured to cause the spacers 100, 106 to behave as waveguides for funneling or guiding electromagnetic radiation 90 (FIG. 26) in a selected direction. For example, the spacer 100 may have a size and shape configured to guide the electromagnetic radiation 90 incident on a surface of the spacer 100 towards the optical grating 101. After the electromagnetic radiation 90 passes through the optical grating 101, the electromagnetic radiation 90 may pass through the optical grating 107 and into the spacer 106. The spacer 106 may have a size and shape configured to guide the electromagnetic radiation 90 that has passed through the optical gratings 101, 107 (and thus carries a geometric interference pattern) towards a radiation detector 94 (FIG. 26). By configuring the spacers 100, 106 as waveguides, the quality of the optical signal and interference pattern carried by the electromagnetic radiation 90 may be enhanced.

In additional embodiments of the present invention, the spacers 100, 106, while including optical gratings (such as, for example, the optical gratings 101, 107), may or may not be configured as waveguides, and may have shapes other than those illustrated in the figures. Furthermore, any number of desired pairs of spacers may be provided on the substrate 10 and the lithography tool 20 and oriented and configured for providing alignment in the X and Y directions.

The methods described herein for aligning a substrate 10 and a lithography tool 20 may be carried out using a lithography system. Various types of lithography systems are known in the art and are commercially available.

Figure 28:
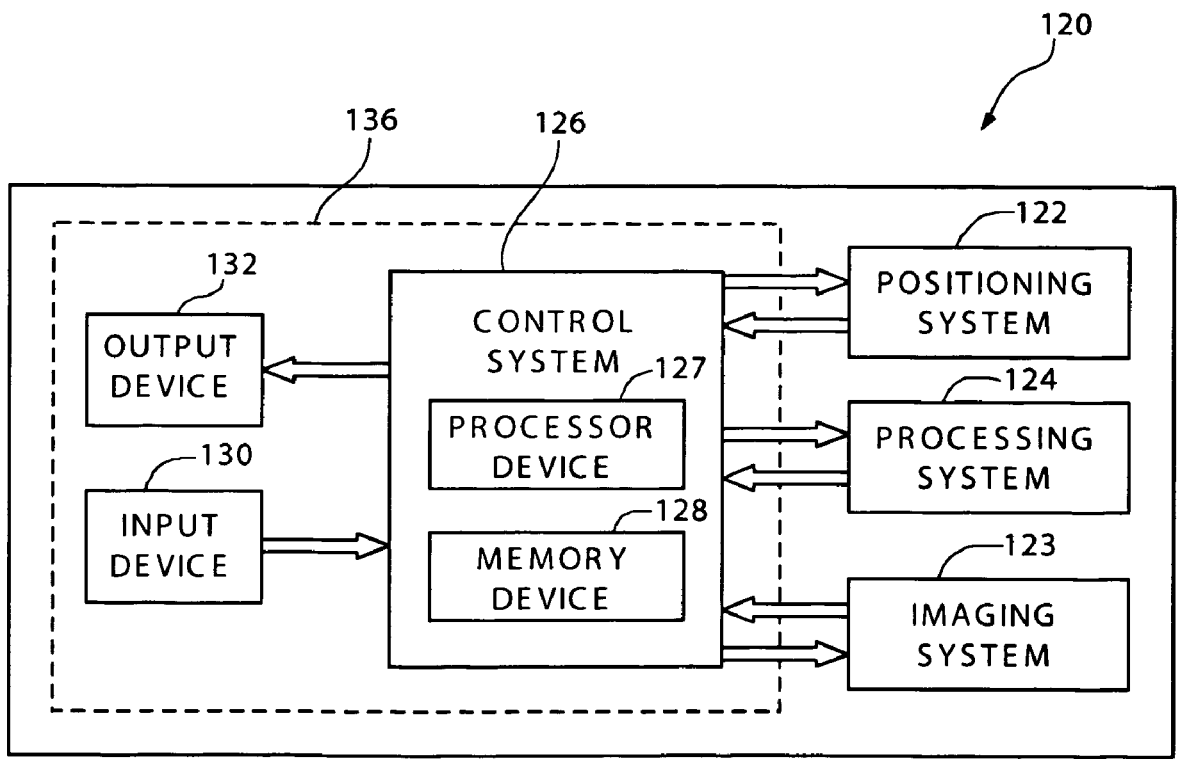
FIG. 28 is a block diagram of one example of a lithography system that may be used to carry out methods that embody teachings of the present invention.

FIG. 28 is a block diagram of one example of a lithography system 120 that may be used to carry out methods that embody teachings of the present invention. As shown therein, the lithography system 120 may include a positioning system 122, an imaging system 123, a processing system 124, and a control system 126. The positioning system 122 may be configured to move a lithography tool (not shown in FIG. 28), a substrate (not shown in FIG. 28), or both a lithography tool and a substrate, so as to position a lithography tool relative to a substrate. In some embodiments, the positioning system 122 may be configured to move a plurality of lithography tools and substrates. The processing system 124 may be configured to process a substrate using lithography tools by, for example, depositing material over the substrate, removing material from the substrate, doping material on or in the substrate, etc.

By way of example and not limitation, the imaging system 123 may include an optical microscopy system, an X-Ray system, or any other imaging system or device that is capable of acquiring an image of at least a portion of a lithography tool and a portion of a substrate. The positioning system 122 may include, for example, a moveable stage (not shown) configured to support a substrate. The positioning system 122 may further include stage actuator devices (not shown) configured to move the moveable stage. Such stage actuator devices may include, for example, commercially available steppers or piezoelectric actuators. In addition to a moveable stage (or as an alternative to a moveable stage), the positioning system 122 may include a moveable tool support device configured to support a lithography tool. Such a moveable tool support device also may be moved using commercially available actuators, as previously described.

The control system 126 may include at least one electronic signal processor device 127 (e.g., a digital signal processor (DSP) device) and at least one memory device 128 (e.g., a device comprising random access memory (RAM) (e.g., static RAM (SRAM), dynamic RAM (DRAM), synchronous DRAM (SDRAM), etc.). By way of example and not limitation, the control system 126 may be or may include a computer system or a computer device such as a desktop computer or a notebook computer. In additional embodiments, the control system 126 may include a commercially available programmable logic controller or a custom-built control system 126 that is both structurally and electrically integrated with the lithography system 120.

As shown in FIG. 28, the control system 126 of the lithography system 120 may be configured to electrically communicate with both the positioning system 122 and the imaging system 123. In this configuration, the control system 126 may be configured to control the positioning system 122 and to receive information from the positioning system 122. For example, the positioning system 122 may include one or more sensors configured to sense or detect a position of a lithography tool, a substrate, or both a lithography tool and a substrate, and to relay information regarding the position to the control system 126 by way of an electrical signal. Similarly, the control system 126 may be configured to control the imaging system 123 and to receive information from the imaging system 123. For example, the imaging system 123 may be configured to transmit digital images (e.g., images of geometric interference patterns) to the control system 126 for analysis thereof by way of an electrical signal. In additional embodiments, the control system 126 may be configured to communicate with the positioning system 122, the imaging system 123, or both the positioning system 122 and the imaging system 123 using wireless technology (e.g., signals transmitted via electromagnetic radiation).

The lithography system 120 may further include at least one input device 130, which may be used by a person using the lithography system 120 to input information to the control system 126 or to provide commands to the control system 126. By way of example and not limitation, the input device 130 may include a computer keyboard, a keypad, a touchpad, a touchscreen, a pointing device (e.g., mouse), or any other means for inputting information or providing commands to the control system 126. In addition, the lithography system 120 may further include at least one output device 132, which may be configured to output information to a user from the control system 126. By way of example and not limitation, the output device 132 may include a graphical display device (such as, for example, a monitor or screen), a printer, a device configured to create audible sounds or alarms, or any other means for outputting information to a user by the control system 126.

As shown in FIG. 28, at least one of the input device 130 and the output device 132 may be structurally integrated with the control system 126, as represented by the broken line 136. As an example, the control system 126 may include a programmable logic controller, the input device 130 may include a keypad or touchpad of the programmable logic controller, and the output device 130 may include a liquid crystal display (LCD) screen of the programmable logic controller. Such programmable logic controllers are commercially available.

In some embodiments of the present invention, substantially all components of the lithography system 120 may be structurally integrated into or with a single structural frame or housing to provide a "stand-alone" unitary system. In other embodiments of the present invention, one or more components of the lithography system 120 may be located remote from other components of the lithography system 120. In such instances, communication may be established between the remote components, for example, by way of electrical communication over electrical wires or wireless communication using electromagnetic radiation.

As previously mentioned, the control system 126 of the lithography system 120 may be configured under control of a program to carry out methods that embody teachings of the present invention using the positioning system 122 and the imaging system 123. In other words, the lithography system 120, and in particular the control system 126 thereof, may be configured under control of a computer program to execute one or more logic sequences, which cause the lithography system 120 to execute methods that embody teachings of the present invention.

Although the foregoing description contains many specifics, these are not to be construed as limiting the scope of the present invention, but merely as providing certain representative embodiments. Similarly, other embodiments of the invention can be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. A method of aligning a lithography tool with a substrate, the method comprising:
    providing a substrate having at least one substrate alignment feature comprising a first optical grating, wherein the first optical grating is configured to have a plurality of alternating light and dark regions;
    providing a lithography tool having at least one tool alignment feature comprising a second optical grating, wherein the second optical grating is configured to have a plurality of alternating light and dark regions, the first optical grating and the second optical grating being configured to generate a Moiré pattern in a beam of electromagnetic radiation when the beam of electromagnetic radiation interacts with both the first optical grating and the second optical grating, the sensitivity of the Moiré pattern varying with the relative alignment between the substrate and the lithography tool;
    configuring the alternating light and dark regions of both the first optical grating and the second optical grating to have at least one of a width, a pitch, and a duty cycle that varies across each respective optical grating;
    positioning the lithography tool relative to the substrate and roughly aligning the tool alignment feature and the substrate alignment feature;
    causing a beam of electromagnetic radiation to interact with both the first optical grating and the second optical grating to generate a Moiré pattern; and
    adjusting the relative position between the substrate and the lithography tool to cause the Moiré pattern to approximate or match a predetermined pattern representing an acceptable degree of alignment between the lithography tool and the substrate.

2. The method of claim 1, wherein the alternating light and dark regions of the first optical grating each have an elongated generally rectangular shape, and wherein the alternating light and dark regions of the second optical grating each have an elongated generally rectangular shape.

3. The method of claim 1, further comprising configuring the alternating light and dark regions of both the first optical grating and the second optical grating to have a central region and two opposite end regions, at least one of a width, a pitch, and a duty cycle differing in the central region from each of the end regions in each respective optical grating.

4. The method of claim 3, further comprising:
    configuring the alternating light and dark regions in the end regions of both the first optical grating and the second optical grating to generate a Moiré pattern having a first sensitivity; and
    configuring the alternating light and dark regions in the central region of both the first optical grating and the second optical grating to generate a Moiré pattern having a second sensitivity, the second sensitivity being higher than the first sensitivity.

5. The method of claim 1, further comprising configuring the first optical grating and the second optical grating to generate a Moiré pattern exhibiting a sensitivity that increases as the relative position between the lithography tool and the substrate is adjusted towards a predetermined alignment position between the lithography tool and the substrate.

6. The method of claim 1, further comprising configuring the first optical grating and the second optical grating to generate a Moiré pattern exhibiting a sensitivity that increases exponentially as the relative position between the lithography tool and the substrate is adjusted towards a predetermined alignment position between the lithography tool and the substrate.

7. A method of aligning a lithography tool with a substrate, the method comprising:
providing a substrate having at least one substrate alignment feature including a first optical grating;
providing a lithography tool having at least one tool alignment feature including a second optical grating, the first optical grating and the second optical grating being configured to generate an interference pattern in a beam of electromagnetic radiation when the beam of electromagnetic radiation is caused to interact with both the first optical grating and the second optical grating;
positioning the lithography tool relative to the substrate and roughly aligning the tool alignment feature and the substrate alignment feature;
causing a beam of electromagnetic radiation to interact with both the first optical grating and the second optical grating to generate an interference pattern comprising a plurality of geometric shapes; and
adjusting the relative position between the substrate and the lithography tool to cause at least one geometric shape of the interference pattern to have at least one of a predetermined size and a predetermined shape representing an acceptable degree of alignment between the lithography tool and the substrate,
wherein adjusting the relative position between the substrate and the lithography tool comprises adjusting the relative position between the substrate and the lithography tool to cause at least one generally triangular shape of the interference pattern to have at least one of a predetermined size and a predetermined shape.

8. The method of claim 7, wherein providing a substrate further comprises configuring the first optical grating to have a plurality of alternating light and dark regions each having an elongated generally rectangular shape, and wherein providing a lithography tool further comprises configuring the second optical grating to have a plurality alternating light and dark regions each having an elongated generally rectangular shape.

9. The method of claim 8, wherein roughly aligning the tool alignment feature and the substrate alignment feature comprises orienting the alternating light and dark regions of the second optical grating at an angle relative to the alternating light and dark regions of the first optical grating.

10. The method of claim 7, further comprising configuring the first optical grating and the second optical grating to generate an interference pattern exhibiting a sensitivity that increases as the relative position between the lithography tool and the substrate is adjusted towards a predetermined alignment position between the lithography tool and the substrate.

11. The method of claim 10, further comprising:
configuring one of the first optical grating and the second optical grating to have a plurality of alternating light and dark regions each having an elongated generally rectangular shape, and
configuring the other of the first optical grating and the second optical grating to have a plurality of alternating light and dark regions each having a curved S shape.

12. A lithography tool comprising an optical grating for aligning the lithography tool relative to a substrate, the optical grating comprising a plurality of alternating light and dark regions configured to generate at least a portion of an interference pattern when a beam of electromagnetic radiation is caused to interact with the optical grating of the lithography tool and an optical grating of the substrate, the interference pattern exhibiting a pattern sensitivity that increases as the relative position between the lithography tool and the substrate is moved towards a predetermined alignment position between the lithography tool and the substrate.

13. The tool of claim 12, wherein the alternating light and dark regions of the optical grating have a substantially rectangular shape.

14. The tool of claim 12, wherein the alternating light and dark regions of the optical grating have a curved S shape.

15. The tool of claim 12, wherein the optical grating is geometrically symmetric about an axis passing approximately through the center of the optical grating.

16. The tool of claim 12, wherein the interference pattern exhibits a pattern sensitivity that increases continuously as the relative position between the lithography tool and the substrate is moved towards the predetermined alignment position between the lithography tool and the substrate.

17. The tool of claim 16, wherein the interference pattern exhibits a pattern sensitivity that increases exponentially as the relative position between the lithography tool and the substrate is moved towards the predetermined alignment position between the lithography tool and the substrate.

18. The tool of claim 12, wherein the plurality of alternating light and dark regions of the optical grating of the lithography tool is configured to generate at least a portion of a Moiré pattern when a beam of electromagnetic radiation is caused to interact with the optical grating of the lithography tool and an optical grating on the substrate.

19. The tool of claim 16, wherein a central region of the optical grating of the lithography tool is configured to generate a portion of a Moiré pattern exhibiting a first pattern sensitivity, and wherein an end region of the optical grating of the lithography tool is configured to generate a portion of a Moiré pattern exhibiting a second pattern sensitivity, the first pattern sensitivity being higher than the second pattern sensitivity.

20. A method of aligning a lithography tool with a substrate, the method comprising:
roughly aligning a lithography tool with a substrate;
passing a beam of electromagnetic radiation between the lithography tool and the substrate without passing through the lithography tool or the substrate;
causing the beam of electromagnetic radiation to interact with both a first optical grating coupled to the substrate and a second optical grating coupled to the lithography tool to generate an interference pattern; and
adjusting a relative position between the substrate and the lithography tool to cause the interference pattern to approximate or match a predetermined pattern representing an acceptable degree of alignment between the lithography tool and the substrate.

21. The method of claim 20, wherein causing the beam of electromagnetic radiation to interact with both a first optical grating coupled to the substrate and a second optical grating coupled to the lithography tool comprises passing the beam of electromagnetic radiation between a first plurality of protrusions extending from a surface of the substrate and between a second plurality of protrusions extending from a surface of the lithography tool to generate the interference pattern.

22. The method of claim 21, wherein passing the beam of electromagnetic radiation between a first plurality of protrusions extending from a surface of the substrate and between a second plurality of protrusions extending from a surface of the lithography tool to generate the interference pattern comprises passing the beam of electromagnetic radiation between a first plurality of protrusions extending from a surface of the substrate and between a second plurality of protrusions extending from a surface of the lithography tool to generate a Moiré pattern.

23. The method of claim 20, wherein roughly aligning a lithography tool with a substrate comprises providing a predetermined spacing between the substrate and the lithography tool using at least one of a first spacer attached to the substrate and a second spacer attached to the lithography tool.

24. The method of claim 23, further comprising providing the first optical grating on the first spacer and providing the second optical grating on the second spacer.

25. The method of claim 24, wherein causing the beam of electromagnetic radiation to interact with both a first optical grating coupled to the substrate and a second optical grating coupled to the lithography tool comprises causing the beam of electromagnetic radiation to pass through the first spacer, the optical grating on the first spacer, the second spacer, and the optical grating on the second spacer.

26. The method of claim 24, further comprising configuring the first spacer and the second spacer as a waveguide.

27. The method of claim 24, wherein causing the beam of electromagnetic radiation to pass through the first spacer and the second spacer comprises:

guiding the electromagnetic radiation towards the first optical grating using the first spacer; and guiding the electromagnetic radiation towards a radiation detector using the second spacer.

* * * * *